US012607936B2

(12) United States Patent
Hirohara et al.

(10) Patent No.: US 12,607,936 B2
(45) Date of Patent: Apr. 21, 2026

(54) FILM-FORMING COMPOSITION HAVING A MULTIPLE BOND

(71) Applicant: NISSAN CHEMICAL CORPORATION, Tokyo (JP)

(72) Inventors: Tomotada Hirohara, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 543 days.

(21) Appl. No.: 18/270,375

(22) PCT Filed: Jan. 26, 2022

(86) PCT No.: PCT/JP2022/002761
§ 371 (c)(1),
(2) Date: Jun. 29, 2023

(87) PCT Pub. No.: WO2022/163676
PCT Pub. Date: Aug. 4, 2022

(65) Prior Publication Data

US 2024/0085792 A1 Mar. 14, 2024

(30) Foreign Application Priority Data

Jan. 27, 2021 (JP) ................................ 2021-011398

(51) Int. Cl.

| | |
|---|---|
| ***G03F 7/11*** | (2006.01) |
| ***C08G 63/688*** | (2006.01) |
| ***C09D 167/00*** | (2006.01) |
| ***G03F 7/36*** | (2006.01) |
| ***H10P 76/20*** | (2026.01) |

(52) U.S. Cl.
CPC .............. *G03F 7/11* (2013.01); *C08G 63/688* (2013.01); *C08G 63/6888* (2013.01); *C09D 167/00* (2013.01); *H10P 76/2042* (2026.01); *H10P 76/2045* (2026.01)

(58) Field of Classification Search
CPC .......... G03F 7/11; G03F 7/36; H10P 76/2042; H10P 76/2045; C08G 63/6888
See application file for complete search history.

(56) References Cited

U.S. PATENT DOCUMENTS

| | | | | |
|---|---|---|---|---|
| 12,019,373 | B2 * | 6/2024 | Lee | G03F 7/027 |
| 2004/0101779 | A1 * | 5/2004 | Wu | G03F 7/038 430/905 |
| 2011/0059404 | A1 | 3/2011 | Sakamoto et al. | |
| 2014/0170567 | A1 | 6/2014 | Sakamoto et al. | |
| 2019/0177475 | A1 | 6/2019 | Ogata et al. | |
| 2022/0187707 | A1 * | 6/2022 | Wakayama | G03F 7/0382 |

FOREIGN PATENT DOCUMENTS

| | | | |
|---|---|---|---|
| WO | 2009/104685 | A1 | 8/2009 |
| WO | 2013/018802 | A1 | 2/2013 |
| WO | 2017/154600 | A1 | 9/2017 |

OTHER PUBLICATIONS

Apr. 19, 2022 International Search Report issued in International Patent Application No. PCT/JP2022/002761.
Jul. 31, 2023 International Preliminary Report on Patentability issued in International Patent Application No. PCT/JP2022/002761.

* cited by examiner

*Primary Examiner* — John S. Chu
(74) *Attorney, Agent, or Firm* — OLIFF PLC

(57) ABSTRACT

A composition for forming a resist underlayer film that enables the formation of a desired resist pattern; and a method for producing a resist pattern and a method for producing a semiconductor device, each of which uses the composition for forming a resist underlayer film. (In formula (1), $A^1$, $A^2$, $A^3$, $A^4$, $A^5$, and $A^6$ each independently represent a hydrogen atom, methyl group, or ethyl group; $Q^1$ represents a divalent organic group; R1 represents a tetravalent organic group; and $R^2$ represents an alkenyl group or alkynyl group having 2-10 carbon atoms.) The film-forming composition contains a solvent and a polymer that has a unit structure given by formula (1).

13 Claims, No Drawings

FILM-FORMING COMPOSITION HAVING A MULTIPLE BOND

TECHNICAL FIELD

The present invention relates to a film-forming composition, preferably a resist underlayer film-forming composition used in a lithography process for the semiconductor production, particularly in a cutting-edge lithography (e.g., ArF, EUV, or EB lithography) process. In addition, the present invention relates to a method for producing a substrate having a resist pattern using the resist underlayer film and a method for producing a semiconductor device.

BACKGROUND ART

In the production of semiconductor devices, microfabrication by lithography using a resist composition has conventionally been conducted. The microfabrication is a fabrication method in which a thin film of a photoresist composition is formed on a semiconductor substrate, such as a silicon wafer, and irradiated with an active ray of light, such as an ultraviolet light, through a mask pattern having a pattern for a device, and subjected to development, and the substrate is subjected to etching treatment using the obtained photoresist pattern as a protective film, forming very small unevenness corresponding to the pattern in the surface of the substrate. In recent years, semiconductor devices are further increased in the integration degree, and, with respect to the active ray of light used for microfabrication, an i-line (wavelength: 365 nm), a KrF excimer laser (wavelength: 248 nm), and an ArF excimer laser (wavelength: 193 nm) have been conventionally used, and further the practical use of an EUV light (extreme ultraviolet light; wavelength: 13.5 nm) or an EB (electron beam) in the most advanced microfabrication is studied. The use of such a ray of light having a short wavelength has a serious problem of effects of a semiconductor substrate on the resist.

As a method for solving the problem, a method of forming a bottom anti-reflective coating (BARC) or a resist underlayer film between a resist and a semiconductor substrate has been widely studied. Patent Literature 1 discloses a resist underlayer film-forming composition comprising a polymer obtained by subjecting at least a tetracarboxylic dianhydride having an alicyclic structure or an aliphatic structure and a diepoxy compound having two epoxy groups to reaction, together with an organic solvent containing an alcohol compound.

CITATION LIST

Patent Literature

Patent Literature 1: WO 2009/104685

SUMMARY OF INVENTION

Technical Problem

The properties required for the film-forming composition, preferably the resist underlayer film, for example, according to the present invention include such properties that intermixing of the resist underlayer film with a resist film formed thereon does not occur (the resist underlayer film is insoluble in a resist solvent), and that the resist underlayer film has a high dry etching rate, as compared to the resist film.

In the lithography using EUV exposure, the formed resist pattern has a line width as small as 32 nm or less, and the resist underlayer film formed and used for EUV exposure has a smaller thickness than a conventional film. In the formation of such a thin film, for example, pinhole or aggregation is likely to be caused due to effects of the surface of a substrate and the polymer used and others, and thus it has been difficult to form a uniform film having no defect.

On the other hand, when forming a resist pattern, in the development step, a method may be employed in which, using a solvent capable of dissolving the resist film, generally using an organic solvent, the unexposed portion of the resist film is removed so that the exposed portion of the resist film remains as a resist pattern. In such a negative development process, an improvement of the adhesion of the resist pattern is an important task.

Further, suppression of unfavorable LWR (line width roughness) when forming a resist pattern, formation of a resist pattern having an excellent rectangular form, and improvement of the resist sensitivity are desired.

An object of the present invention is to provide a composition which has solved the above-mentioned problems, and which is for use in forming a resist underlayer film that is capable of forming a desired resist pattern, and a method for forming a resist pattern using the resist underlayer film-forming composition.

Solution to Problem

The present invention encompasses the followings.

[1]

A film-forming composition comprising a solvent and a polymer having a unit structure represented by the following formula (1):

[Chemical formula 1]

(1)

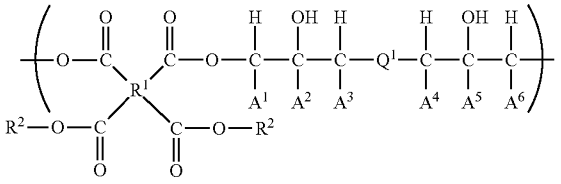

wherein each of $A^1$, $A^2$, $A^3$, $A^4$, $A^5$, and $A^6$ independently represents a hydrogen atom, a methyl group, or an ethyl group; $Q^1$ represents a divalent organic group; $R^1$ represents a tetravalent organic group; and $R^2$ represents an alkenyl group or alkynyl group having 2 to 10 carbon atoms.

[2]

The film-forming composition according to item [1], wherein $R^1$ has an aromatic ring structure having 6 to 40 carbon atoms or an alicyclic structure having 4 to 20 carbon atoms.

[3]

The film-forming composition according to item [1] or [2], wherein $R^1$ is represented by the following formula (2):

[Chemical formula 2]

(2)

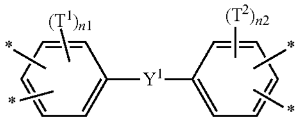

wherein $Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group; each of $T^1$ and $T^2$ independently represents a hydrogen atom or an alkyl group having 1 to 10 carbon atoms; each of n1 and n2 independently represents an integer of 0 to 4; and * is a bonding site to the carbon atom of carbonyl group to which $R^1$ is bonded.

[4]

The film-forming composition according to any one of items [1] to [3], wherein $Q^1$ has an alkenyl group or alkynyl group having 2 to 10 carbon atoms.

[5]

The film-forming composition according to any one of items [1] to [4], wherein $Q^1$ has a heterocycle.

[6]

The film-forming composition according to any one of items [1] to [5], wherein the polymer has at an end thereof an alkenyl group or alkynyl group having 2 to 10 carbon atoms.

[7]

The film-forming composition according to any one of items [1] to [6], wherein the polymer has at an end thereof an optionally substituted aliphatic ring.

[8]

The film-forming composition according to any one of items [1] to [7], further comprising an acid generator.

[9]

The film-forming composition according to any one of items [1] to [8], further comprising a crosslinking agent.

[10]

Use of the film-forming composition according to any one of items [1] to [9] for forming a resist underlayer film.

[11]

A resist underlayer film which is a baked product of an applied film of the film-forming composition according to any one of items [1] to [9].

[12]

A method for producing a patterned substrate, comprising the steps of:

applying the film-forming composition according to any one of items [1] to [9] onto a semiconductor substrate and baking the applied composition to form a resist underlayer film;

applying a resist onto the resist underlayer film and baking the applied resist to form a resist film;

exposing the semiconductor substrate covered with the resist underlayer film and the resist; and developing the exposed resist film and performing patterning.

[13]

A method for producing a semiconductor device, comprising the steps of:

forming a resist underlayer film comprising the film-forming composition according to any one of items [1] to [9] above on a semiconductor substrate;

forming a resist film on the resist underlayer film;

irradiating the resist film with a light or an electron beam and then developing the resultant resist film to form a resist pattern;

etching the resist underlayer film through the formed resist pattern to form a patterned resist underlayer film; and processing the semiconductor substrate using the patterned resist underlayer film.

Advantageous Effects of Invention

A resist underlayer film formed from the film-forming composition, preferably the resist underlayer film-forming composition, according to the present invention exhibits excellent resistance to an organic solvent used for a photoresist formed on the resist underlayer film, and further has high film hardness. In addition, when a resist pattern is formed using the resist underlayer film-forming composition of the present invention, the critical resolution size with which no resist pattern collapse occurs after development is considerably reduced, as compared to that of a conventional resist underlayer film, enabling formation of an even finer resist pattern. Further, an effect can be obtained such that the range of the resist pattern size in which excellent pattern can be obtained is increased, as compared to that of the prior art.

DESCRIPTION OF EMBODIMENTS

<Film-Forming Composition>

The film-forming composition of the present invention comprises a solvent and a polymer having a unit structure represented by the following formula (1):

[Chemical formula 3]

(1)

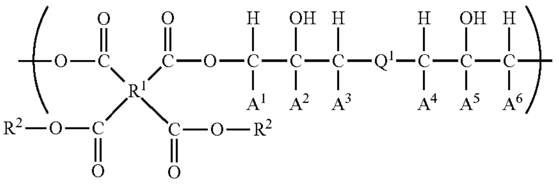

wherein each of $A^1$, $A^2$, $A^3$, $A^4$, $A^5$, and $A^6$ independently represents a hydrogen atom, a methyl group, or an ethyl group; $Q^1$ represents a divalent organic group; $R^1$ represents a tetravalent organic group; and $R^2$ represents an alkenyl group or alkynyl group having 2 to 10 carbon atoms.

The film-forming composition of the present invention may be a resist underlayer film used in the lithography process in the below-mentioned semiconductor production process.

Examples of the alkenyl groups having 2 to 10 carbon atoms include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the alkynyl groups having 2 to 10 carbon atoms include an ethynyl group, a 1-propynyl group, a 2-propynyl group, a 1-butynyl group, a 2-butynyl group, a 3-butynyl group, a 4-methyl-1-pentynyl group, and a 3-methyl-1-pentynyl group.

$R^1$ may have an aromatic ring structure having 6 to 40 carbon atoms or an alicyclic structure having 4 to 20 carbon atoms.

Examples of the aromatic ring structures having 6 to 40 carbon atoms include aromatic ring structures derived from benzene, naphthalene, anthracene, acenaphthene, fluorene, triphenylene, phenalene, phenanthrene, indene, indan, indacene, pyrene, chrysene, perylene, naphthacene, pentacene, coronene, heptacene, benzo[a]anthracene, dibenzophenanthrene, or dibenzo[a,j]anthracene.

Examples of the alicyclic structures having 4 to 20 carbon atoms include alicyclic structures derived from cyclobutane, cyclopentane, cyclohexane, cycloheptane, cyclooctane, cyclononane, cyclodecane, spirobicyclopentane, bicyclo[2.1.0]pentane, bicyclo[3.2.1]octane, tricyclo[3.2.1.$0^{2,7}$]octane, or spiro[3,4]octane.

$R^1$ may be represented by the following formula (2):

[Chemical formula 4]

(2)

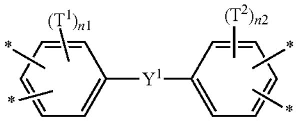

wherein $Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group; each of $T^1$ and $T^2$ independently represents a hydrogen atom or an alkyl group having 1 to 10 carbon atoms; each of n1 and n2 independently represents an integer of 0 to 4; and * is a bonding site to the carbon atom of carbonyl group to which $R^1$ is bonded.

Examples of the halogen atoms include fluorine, chlorine, iodine, and bromine. It is preferred that $Y^1$ is a sulfonyl group, and $T^1$ and $T^2$ are a hydrogen atom.

Examples of the aryl groups having 6 to 40 carbon atoms include a benzyl group, a naphthyl group, an anthracenyl group, a phenanthrenyl group, and a pyrenyl group.

Examples of the alkylene groups having 1 to 10 carbon atoms include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, a n-heptylene group, a n-octylene group, a n-nonylene group, and a n-decanylene group.

$R^1$ may be derived from a compound represented by the following formula (2-1):

[Chemical formula 5]

(2-1)

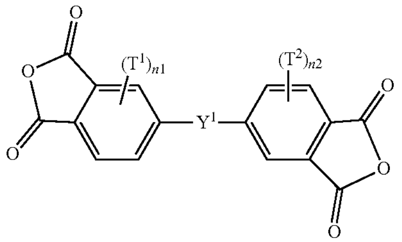

wherein $Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group; each of $T^1$ and $T^2$ independently represents a hydrogen atom or an alkyl group having 1 to 10 carbon atoms; and each of n1 and n2 independently represents an integer of 0 to 4.

$Q^1$ may have an alkenyl group or alkynyl group having 2 to 10 carbon atoms.

Specific examples are as mentioned above.

$Q^1$ may have a heterocycle. Examples of the heterocycles include furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine, carbazole, triazinone, triazinedione, and triazinetrione.

$Q^1$ may be derived from the compound represented by the following formulae.

[Chemical formula 6]

(10-a)

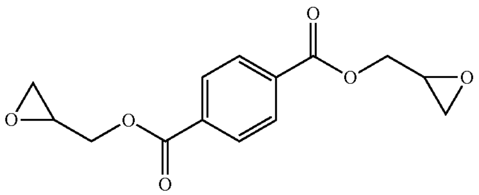

(10-b)

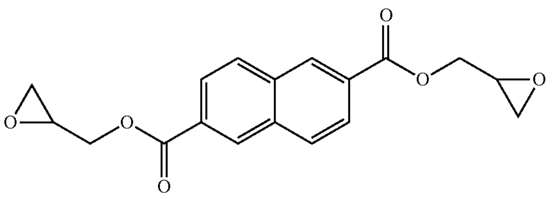

-continued (10-c)

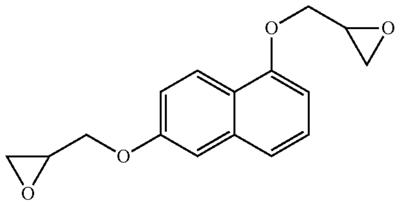

(10-d)

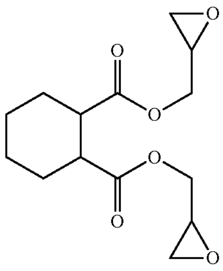

(10-e)

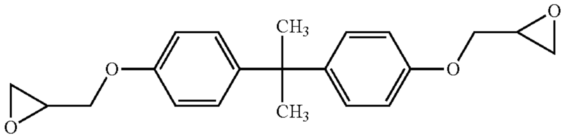

(10-f)

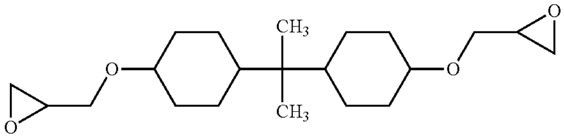

(10-g)

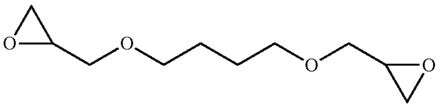

(10-h)

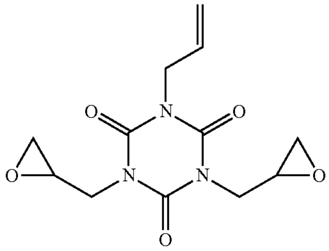

(10-i)

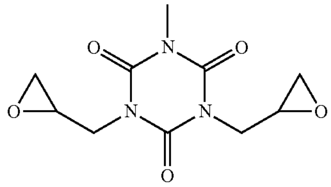

(10-j)

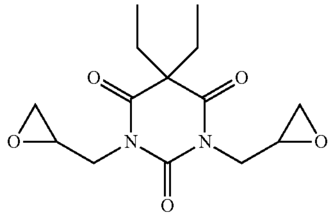

-continued (10-k)

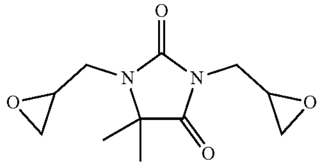

The polymer having the unit structure of formula (1) in the present invention may, when end capping of the polymer with, for example, a compound represented by formula (2-1) is conducted, be a reaction product obtained by reacting an aliphatic ring compound having two carboxyl groups and a compound represented by the following formula 3 or formula (3-1):

[Chemical formula 7]

$$H_2C{=}\underset{H}{C}{-}(CH_2)_{n3}OH \quad \text{Formula 3}$$

$$HC{\equiv}C{-}(CH_2)_{n3}OH \quad \text{Formula (3-1)}$$

wherein n3 represents an integer of 1 to 8, and further reacting formula (10-a) to formula (10-k) above.

The polymer may have at an end thereof an alkenyl group or alkynyl group having 2 to 10 carbon atoms. The polymer preferably has at an end thereof the carbon-carbon double bond of the alkenyl group or the carbon-carbon triple bond of the alkynyl group. The polymer may have at an end thereof an optionally substituted aliphatic ring.

The end capping compound preferably has an optionally substituted aliphatic ring.

The aliphatic ring is preferably a monocyclic or polycyclic aliphatic ring having 3 to 10 carbon atoms. Examples of the monocyclic or polycyclic aliphatic rings having 3 to 10 carbon atoms include cyclopropane, cyclobutane, cyclopentane, cyclohexane, cyclohexene, cycloheptane, cyclooctane, cyclononane, cyclodecane, spirobicyclopentane, bicyclo[2.1.0]pentane, bicyclo[3.2.1]octane, tricyclo[3.2.1.0$^{2,7}$]octane, spiro[3,4]octane, norbornane, norbornene, and tricyclo[3.3.1.1$^{3,7}$]decane (adamantane).

The polycyclic aliphatic ring is preferably a bicyclo-ring or a tricyclo-ring.

Examples of the bicyclo-rings include norbornane, norbornene, spirobicyclopentane, bicyclo[2.1.0]pentane, bicyclo[3.2.1]octane, and spiro[3,4]octane.

Examples of the tricyclo-rings include tricyclo[3.2.1.0$^{2,7}$]octane and tricyclo[3.3.1.1$^{3,7}$]decane (adamantane).

The expression "optionally substituted aliphatic ring" means that at least one hydrogen atom of the aliphatic ring is optionally replaced by the below-mentioned substituent.

The substituent is preferably selected from a hydroxy group, a linear or branched alkyl group having 1 to 10 carbon atoms, an alkoxy group having 1 to 20 carbon atoms, an acyloxy group having 1 to 10 carbon atoms and optionally being interrupted by an oxygen atom, and a carboxyl group.

Examples of the alkoxy groups having 1 to 20 carbon atoms include a methoxy group, an ethoxy group, a n-propoxy group, an i-propoxy group, a n-butoxy group, an i-butoxy group, a s-butoxy group, a t-butoxy group, a n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, a cyclopentyloxy group, a cyclohexyloxy group, a norbornyloxy group, an adamantyloxy group, an adamantanemethyloxy group, an adamantaneethyloxy group, a tetracyclodecanyloxy group, and a tricyclodecanyloxy group.

The aliphatic ring preferably has at least one unsaturated bond (for example, double bond or triple bond). The aliphatic ring preferably has one to three unsaturated bonds. The aliphatic ring preferably has one or two unsaturated bonds. The unsaturated bond is preferably a double bond.

Specific examples of compounds having an optionally substituted aliphatic ring include the compounds shown below. Further specific examples of the compounds include compounds of the below-shown specific examples in which the carboxyl group is replaced by a hydroxy group, an amino group, or a thiol group.

[Chemical formula 8]

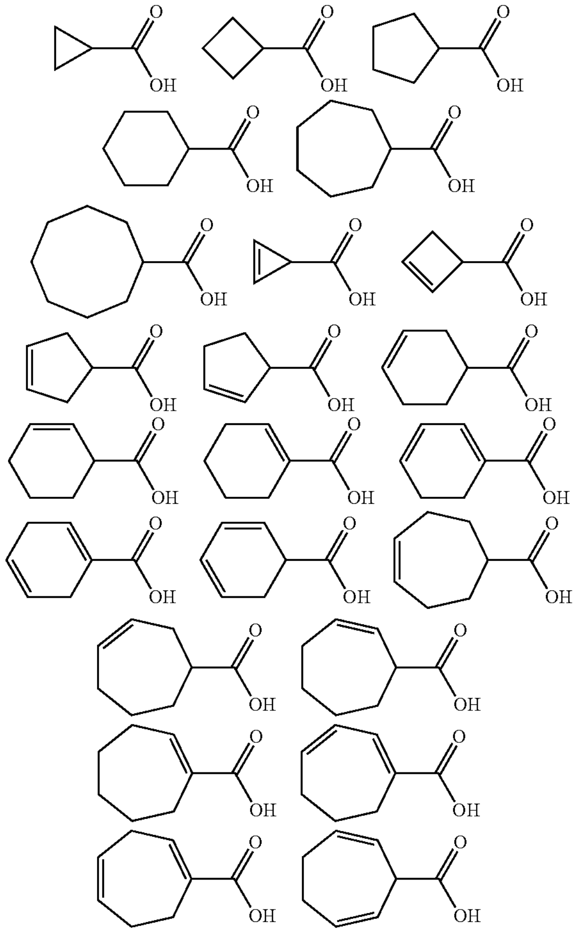

-continued
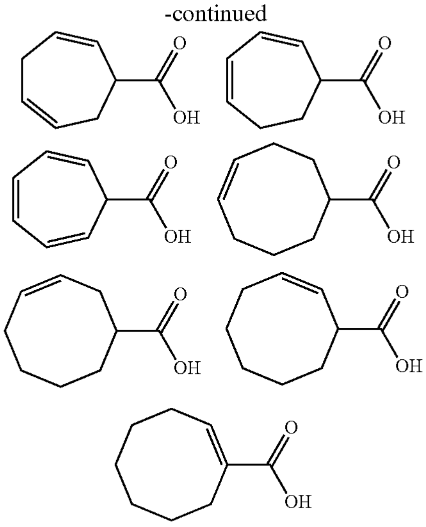
[Chemical formula 9]
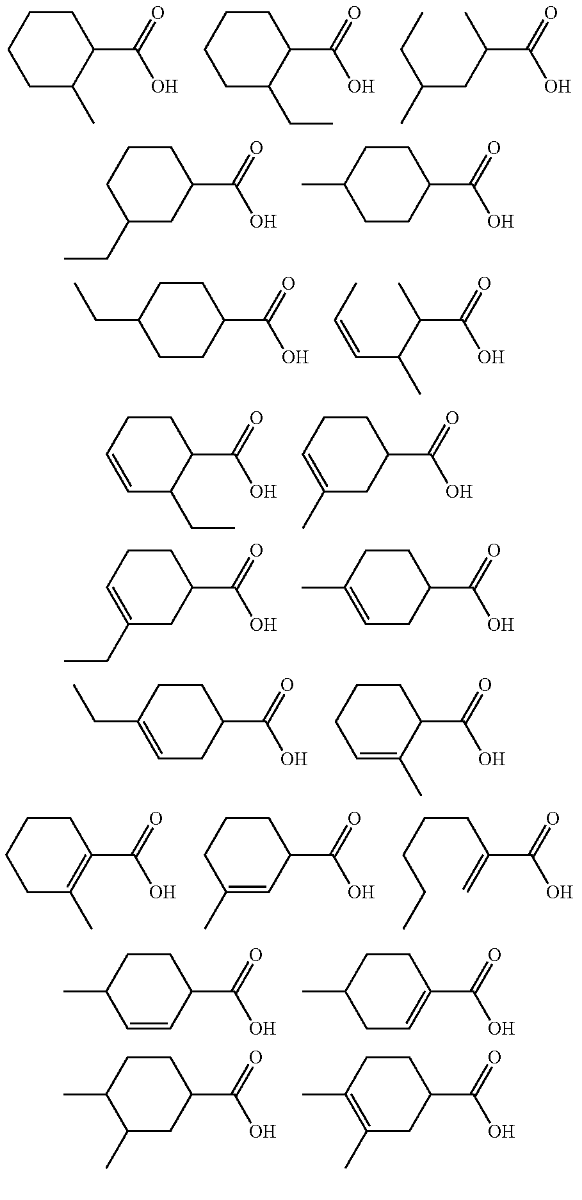
-continued
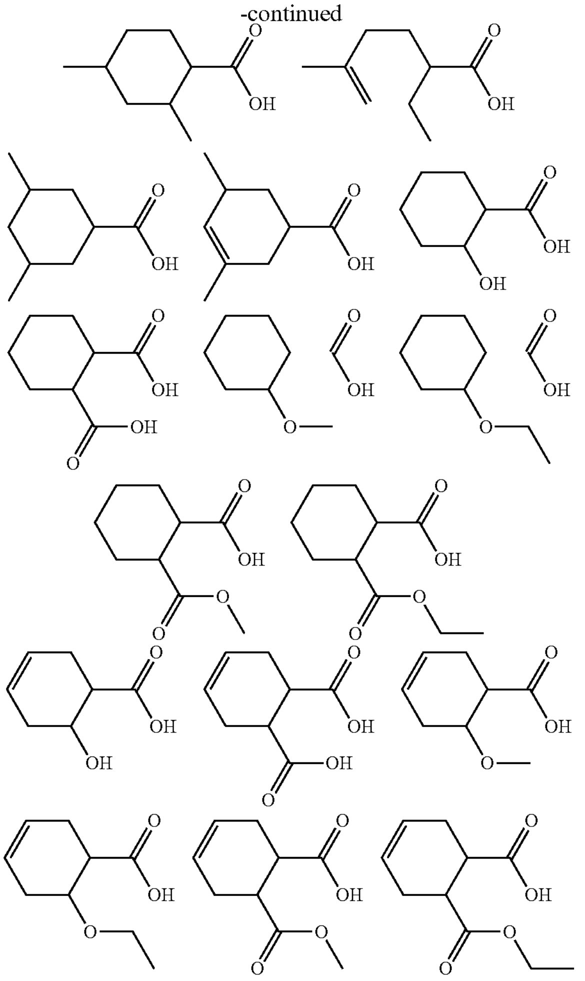
[Chemical formula 10]
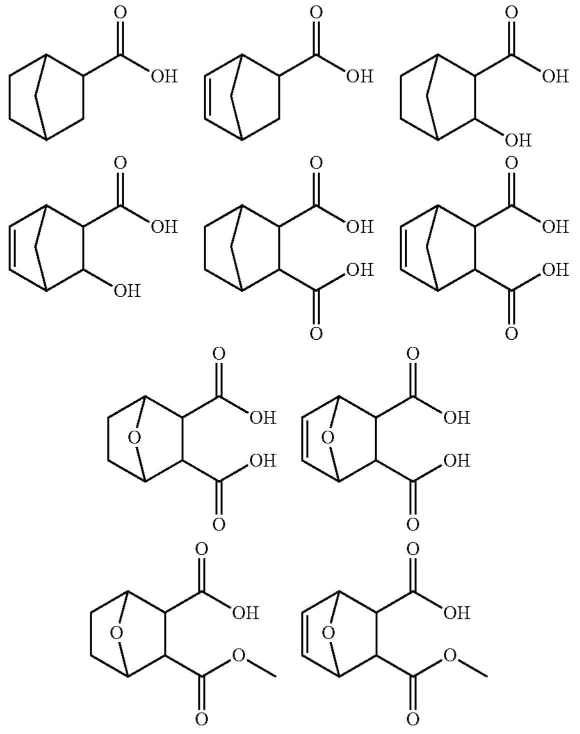

-continued

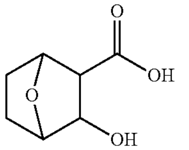
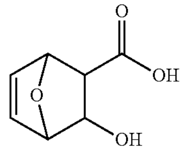
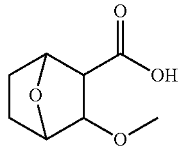
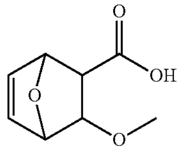
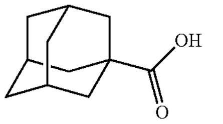
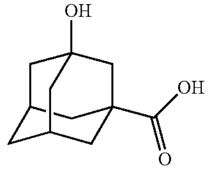
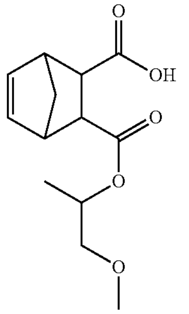
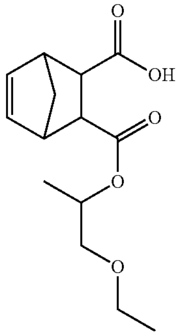
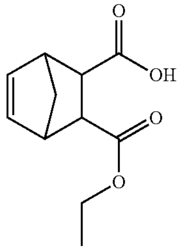
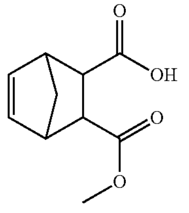
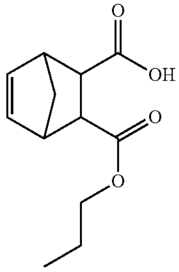
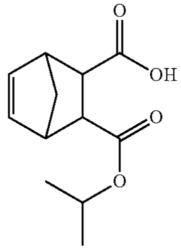

The polymer preferably has a weight average molecular weight of 500 to 50,000, more preferably 1,000 to 30,000. The weight average molecular weight can be measured by, for example, the gel permeation chromatography method described in the Examples below.

The amount of the polymer contained is generally within the range of 0.05 to 3.0% by mass, 0.08 to 2.0% by mass, or 0.1 to 1.0% by mass, based on the mass of the resist underlayer film-forming composition of the present invention.

With respect to the solvent contained in the resist underlayer film-forming composition of the present invention, preferred is an organic solvent generally used in a semiconductor lithography process. Specific examples of solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, propylene glycol monomethyl ether, propylene glycol monomethyl ether acetate, ethyl lactate, butyl lactate, and cyclohexanone are preferred. Especially preferred are propylene glycol monomethyl ether and propylene glycol monomethyl ether acetate.

<Acid Generator>

With respect to the acid generator contained as an optional component in the film-forming composition of the present invention, any of a thermal acid generator and a photo-acid generator may be used, but a thermal acid generator is preferably used. Examples of thermal acid generator include sulfonic acid compounds and carboxylic acid compounds, such as p-toluenesulfonic acid, trifluoromethanesulfonic acid, pyridinium p-toluenesulfonate, pyridinium p-hydroxybenzenesulfonate (pyridinium p-phenol sulfonate), pyridinium trifluoromethanesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, hydroxybenzoic acid, N-methylmorpholine-p-toluenesulfonic acid, N-methylmorpholine-p-hydroxybenzenesulfonic acid, and N-methylmorpholine-5-sulfosalicylic acid.

Examples of the photo-acid generator include an onium salt compound, a sulfonimide compound, and a disulfonyldiazomethane compound.

Examples of onium salt compound include iodonium compounds, such as diphenyliodonium hexafluorophosphate, diphenyliodonium trifluoromethanesulfonate, diphenyliodonium nonafluoronormalbutanesulfonate, diphenyliodonium perfluoronormaloctanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoronormalbutanesulfonate, triphenylsulfonium camphorsulfonate, and triphenylsulfonium trifluoromethanesulfonate.

Examples of sulfonimide compound include N-(trifluoromethanesulfonyloxy)succinimide, N-(nonafluoronormalbutanesulfonyloxy)succinimide, N-(camphorsulfonyloxy)succinimide, and N-(trifluoromethanesulfonyloxy) naphthalimide.

Examples of disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methyl sulfonyl-p-toluenesulfonyldiazomethane.

The acid generators may be used each alone or in combination of two or more thereof.

When the acid generator is used, the amount of the acid generator contained is, for example, within the range of 0.1 to 50% by mass, preferably 1 to 30% by mass, based on the mass of the below-mentioned crosslinking agent.

<Crosslinking Agent>

Examples of the crosslinking agent contained as an optional component in the film-forming composition of the present invention include hexamethoxymethylmelamine, tetramethoxymethylbenzoguanamine, 1,3,4,6-tetrakis (methoxymethyl)glycoluril (tetramethoxymethylglycoluril) (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis (methoxymethyl)urea.

Further, the crosslinking agent in the present invention may be the nitrogen-containing compound described in WO 2017/187969, wherein the compound has per molecule 2 to 6 substituents which are bonded to a nitrogen atom and represented by the following formula (1d):

[Chemical formula 11]

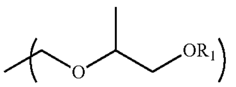

(1d)

wherein $R_1$ represents a methyl group or an ethyl group.

The nitrogen-containing compound having per molecule 2 to 6 substituents represented by formula (1d) above may be a glycoluril derivative represented by the following formula (1E):

[Chemical formula 12]

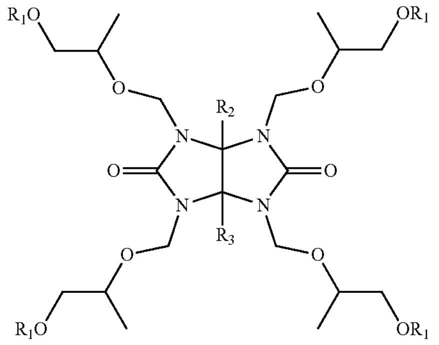

(1E)

wherein each of four $R_1$s independently represents a methyl group or an ethyl group, and each of $R_2$ and $R_3$ independently represents a hydrogen atom, an alkyl group having 1 to 4 carbon atoms, or a phenyl group.

Examples of the glycoluril derivative represented by formula (1E) include compounds represented by the following formulae (1E-1) to (1E-6).

[Chemical formula 13]

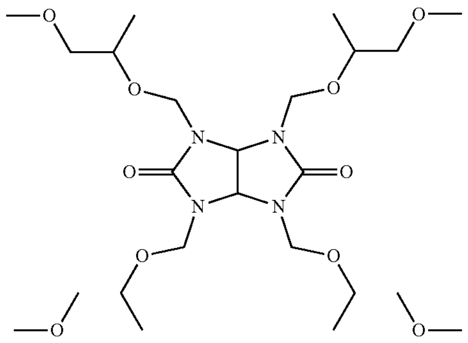

(1E-1)

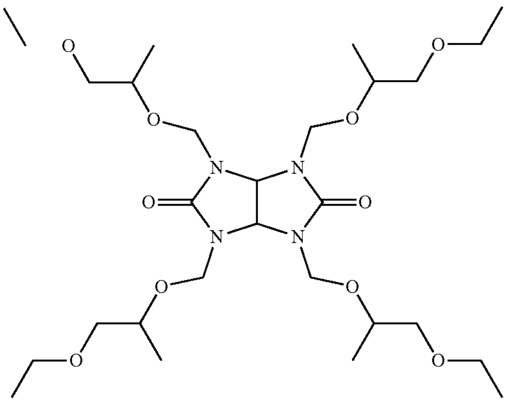

(1E-2)

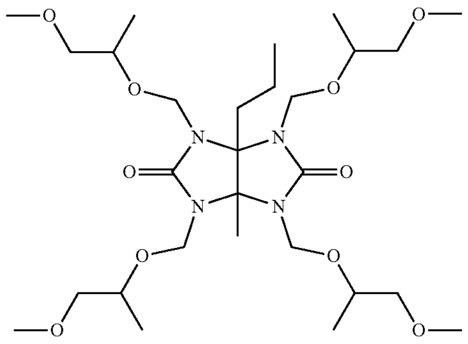

(1E-3)

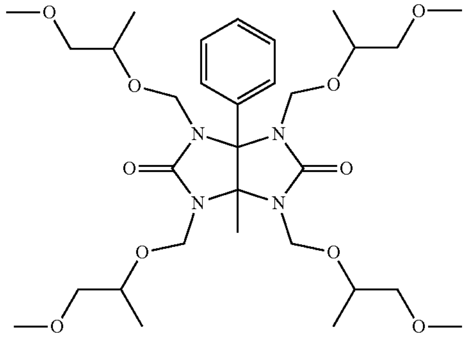

(1E-4)

-continued (1E-5)

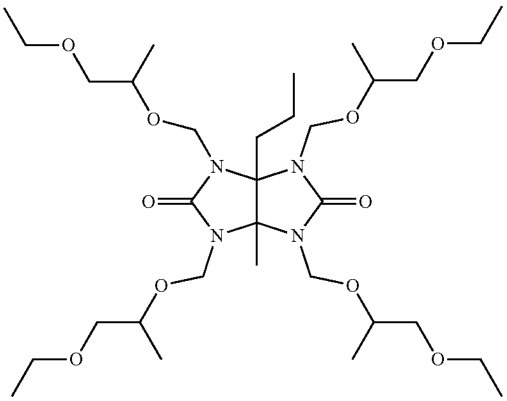

(1E-6)

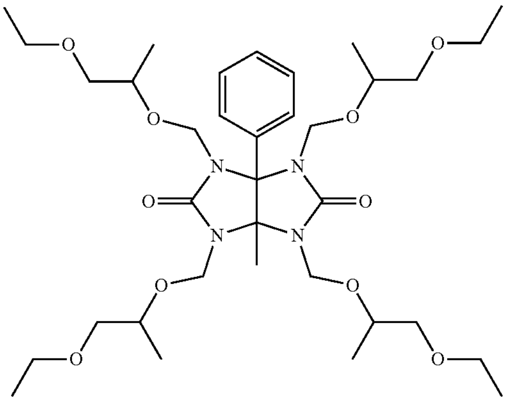

The nitrogen-containing compound having per molecule 2 to 6 substituents represented by formula (1d) may be obtained by reacting a nitrogen-containing compound having per molecule 2 to 6 substituents, which are bonded to a nitrogen atom and represented by the following formula (2d), and at least one compound represented by the following formula (3d):

[Chemical formula 14]

(2d)

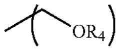

(3d)

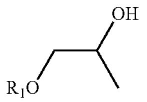

wherein, in formula (3d), $R_1$ represents a methyl group or an ethyl group, and, in formula (2d), $R_4$ represents an alkyl group having 1 to 4 carbon atoms.

The glycoluril derivative represented by formula (1E) may be obtained by reacting a glycoluril derivative represented by formula (2E) below and at least one compound represented by formula (3d) above.

The nitrogen-containing compound having per molecule 2 to 6 substituents represented by formula (2d) above is, for example, a glycoluril derivative represented by the following formula (2E):

[Chemical formula 15]

(2E)

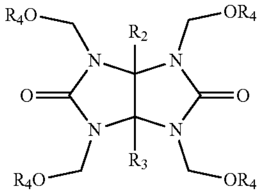

wherein each of $R_2$ and $R_3$ independently represents a hydrogen atom, an alkyl group having 1 to 4 carbon atoms, or a phenyl group, and each $R_4$ independently represents an alkyl group having 1 to 4 carbon atoms.

Examples of the glycoluril derivative represented by formula (2E) include compounds represented by the following formulae (2E-1) to (2E-4). Further, examples of the compound represented by formula (3d) include compounds represented by the following formulae (3d-1) and (3d-2).

[Chemical formula 16]

(2E-1)

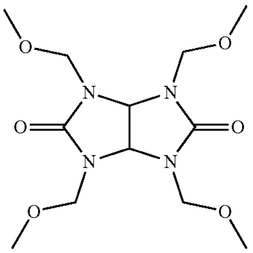

(2E-2)

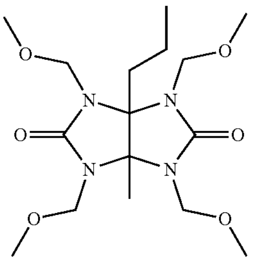

(2E-3)

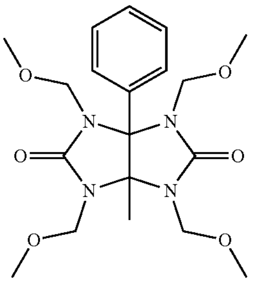

-continued (2E-4)

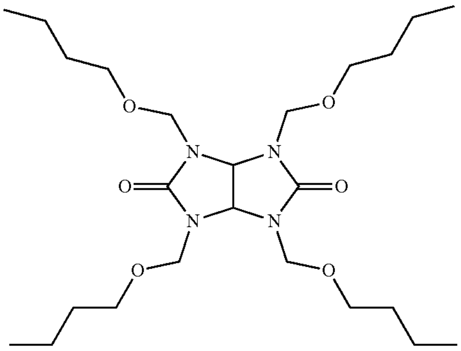

[Chemical formula 17]

(3d-1)

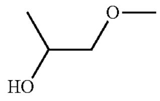

(3d-2)

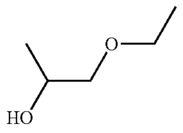

With respect to the description of the nitrogen-containing compound having per molecule 2 to 6 substituents which are bonded to a nitrogen atom and represented by formula (1d), the entire disclosure of WO 2017/187969 is incorporated herein by reference.

Further, the crosslinking agent may be the crosslinkable compound which is described in WO 2014/208542, and represented by the following formula (G-1) or (G-2):

[Chemical formula 18]

Formula (G-1)

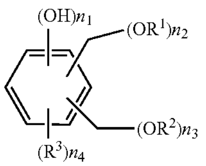

Formula (G-2)

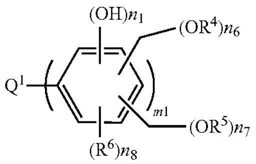

wherein $Q^1$ represents a single bond or an m1-valent organic group, each of $R^1$ and $R^4$ represents an alkyl group having 2 to 10 carbon atoms, or an alkyl group having 2 to 10 carbon atoms and having an alkoxy group having 1 to 10 carbon atoms, each of $R^2$ and $R^5$ represents a hydrogen atom or a methyl group, each of $R^3$ and $R^6$ represents an alkyl group having 1 to 10 carbon atoms or an aryl group having 6 to 40 carbon atoms, n1 represents an integer of: $1 \leq n1 \leq 3$, n2 represents an integer of: $2 \leq n2 \leq 5$, n3 represents an integer of: $0 \leq n3 \leq 3$, n4 represents an integer of: $0 \leq n4 \leq 3$, wherein n1, n2, n3, and n4 satisfy the relationship: $3 \leq (n1+n2+n3+n4) \leq 6$, n5 represents an integer of: $1 \leq n5 \leq 3$, n6 represents an integer of: $1 \leq n6 \leq 4$, n7 represents an integer of: $0 \leq n7 \leq 3$, n8 represents an integer of: $0 \leq n8 \leq 3$, wherein n5, n6, n7, and n8 satisfy the relationship: $2 \leq (n5+n6+n7+n8) \leq 5$, and m1 represents an integer of 2 to 10.

The crosslinkable compound represented by formula (G-1) or (G-2) above may be one which is obtained by allowing a compound represented by the following formula (G-3) or (G-4) to react with a hydroxy group-containing ether compound or an alcohol having 2 to 10 carbon atoms:

[Chemical formula 19]

Formula (G-3)

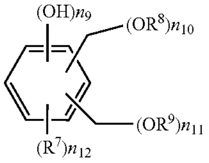

Formula (G-4)

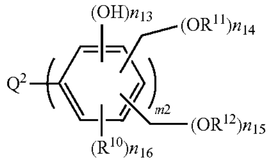

wherein $Q^2$ represents a single bond or an m2-valent organic group, each of $R^8$, $R^9$, $R^{11}$, and $R^{12}$ represents a hydrogen atom or a methyl group, each of $R^7$ and $R^{10}$ represents an alkyl group having 1 to 10 carbon atoms or an aryl group having 6 to 40 carbon atoms, n9 represents an integer of: $1 \leq n9 \leq 3$, n10 represents an integer of: $2 \leq n10 \leq 5$, n11 represents an integer of: $0 \leq n11 \leq 3$, n12 represents an integer of: $0 \leq n12 \leq 3$, wherein n9, n10, n11, and n12 satisfy the relationship: $3 \leq (n9+n10+n11+n12) \leq 6$, n13 represents an integer of: $1 \leq n13 \leq 3$, n14 represents an integer of: $1 \leq n14 \leq 4$, n15 represents an integer of: $0 \leq n15 \leq 3$, n16 represents an integer of: $0 \leq n16 \leq 3$, wherein n13, n14, n15, and n16 satisfy the relationship: $2 \leq (n13+n14+n15+n16) \leq 5$, and m2 represents an integer of 2 to 10.

Examples of the compounds represented by formula (G-1) or (G-2) above include the followings.

[Chemical formula 20]

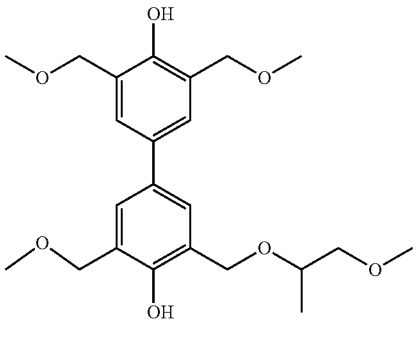

-continued
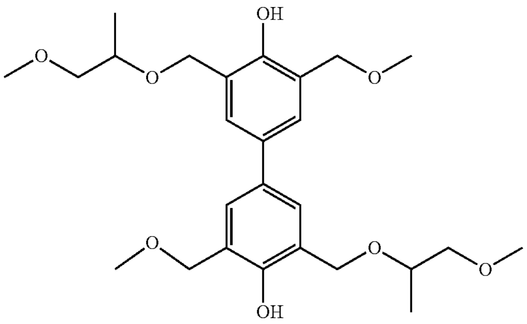
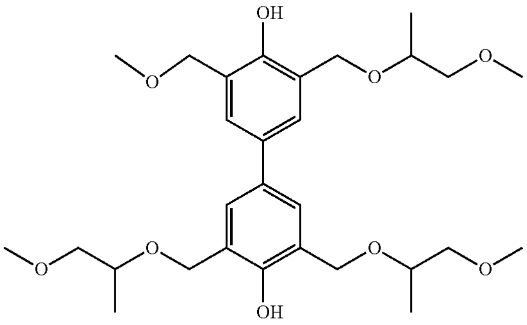
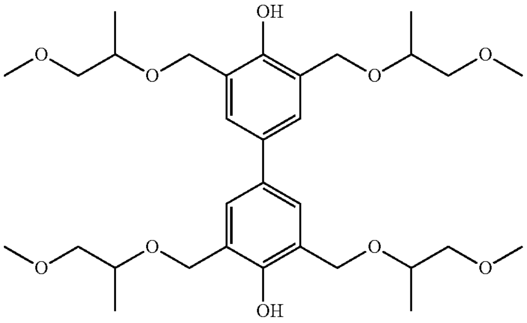
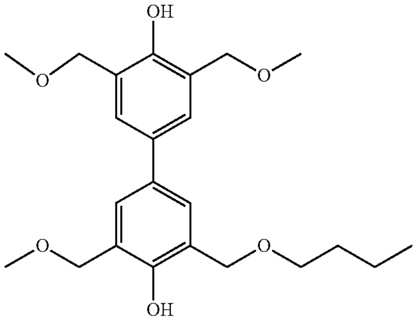
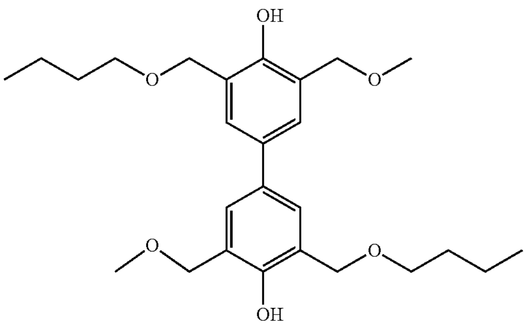
-continued
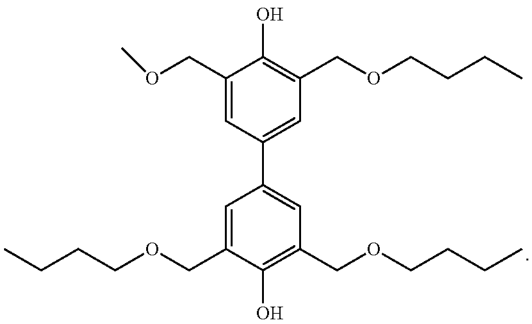
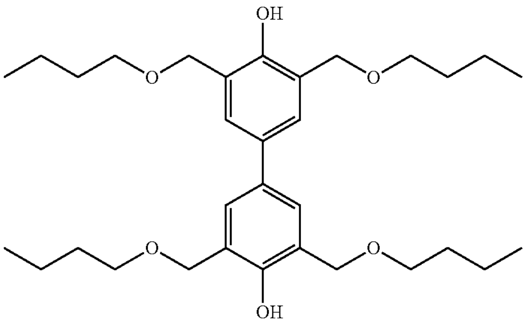
[Chemical formula 21]
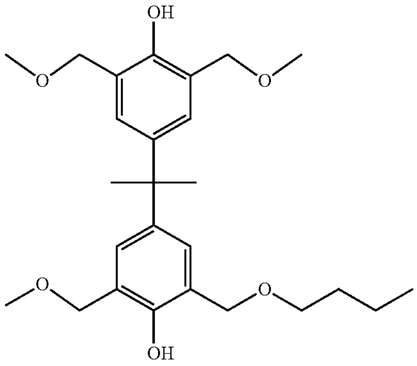
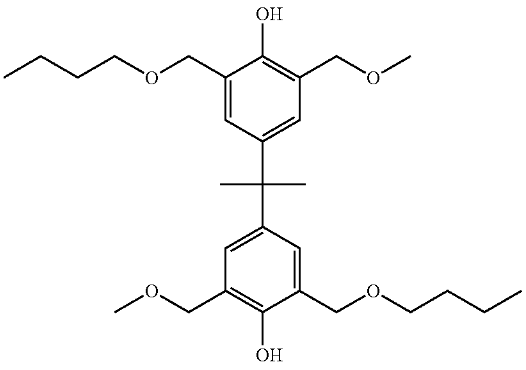

-continued
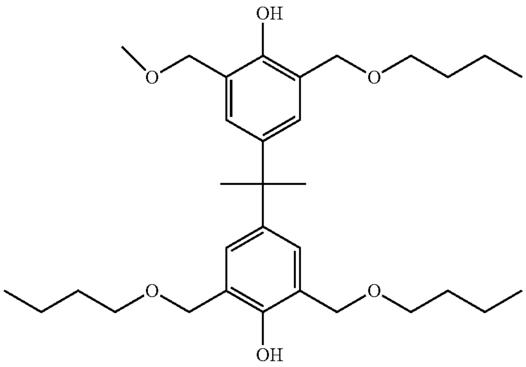
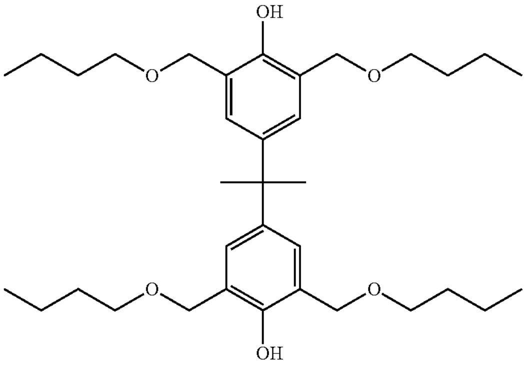
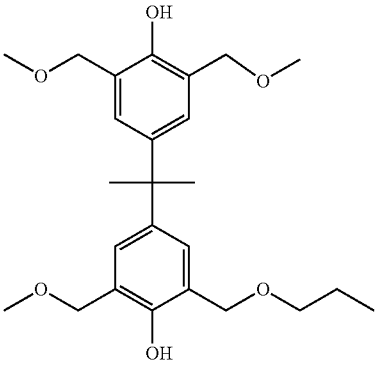
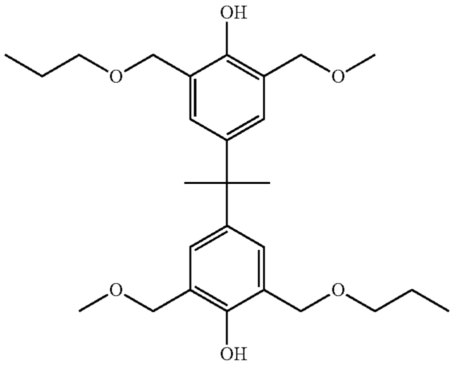
-continued
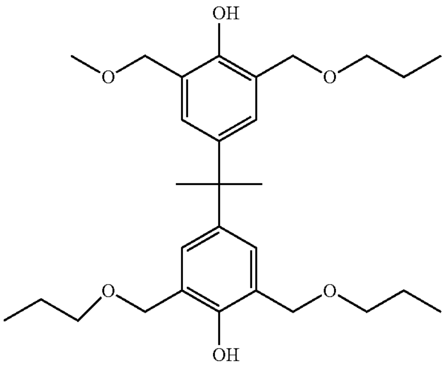
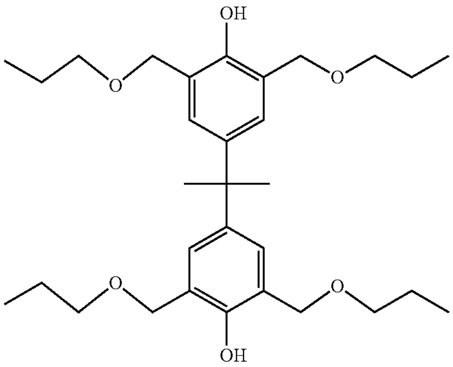
[Chemical formula 22]
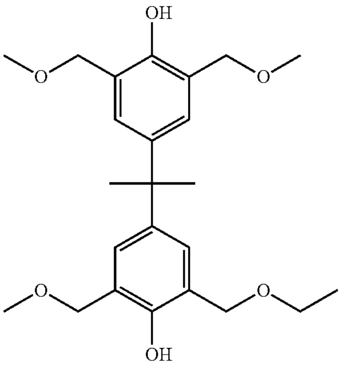
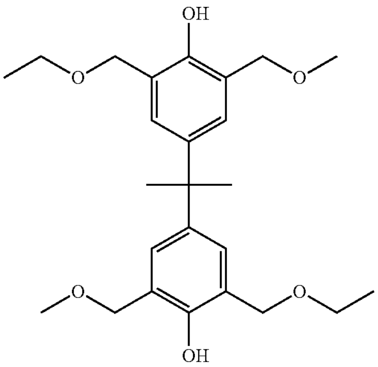

-continued
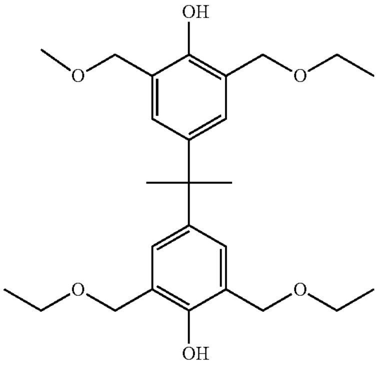
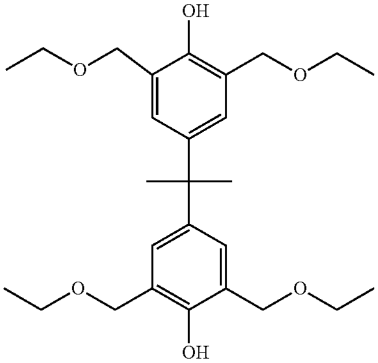
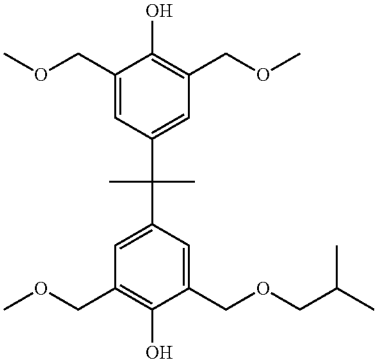
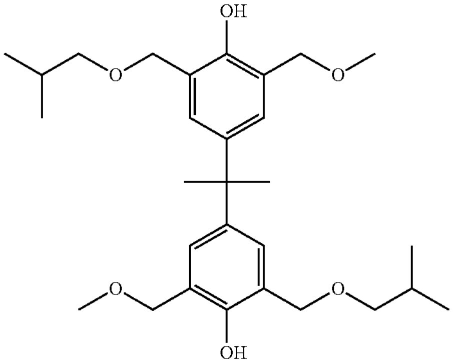
-continued
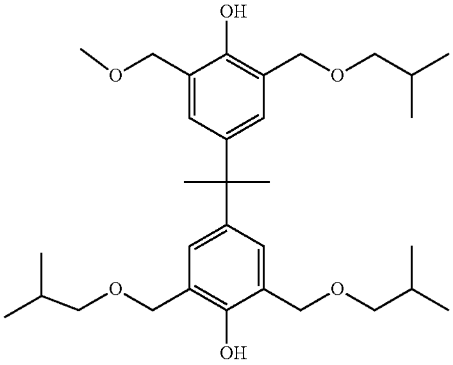
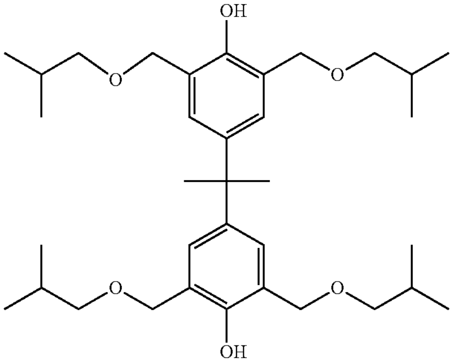
[Chemical formula 23]
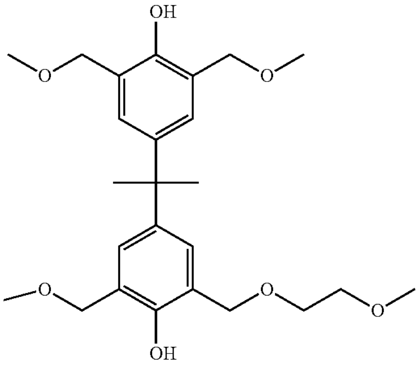
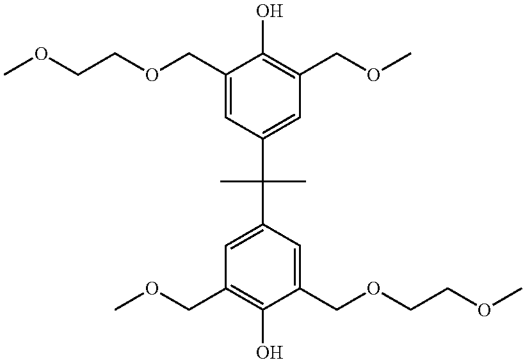

-continued
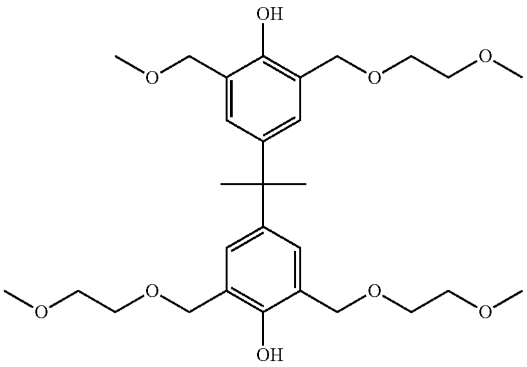
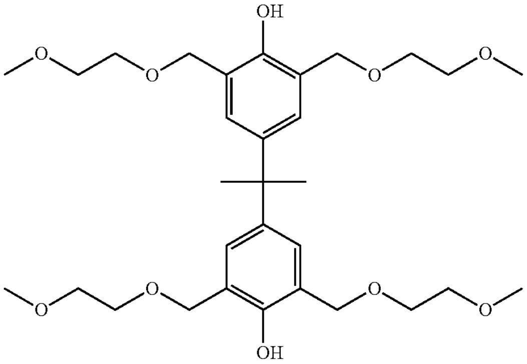
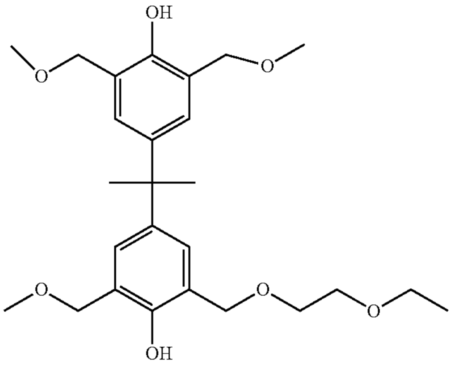
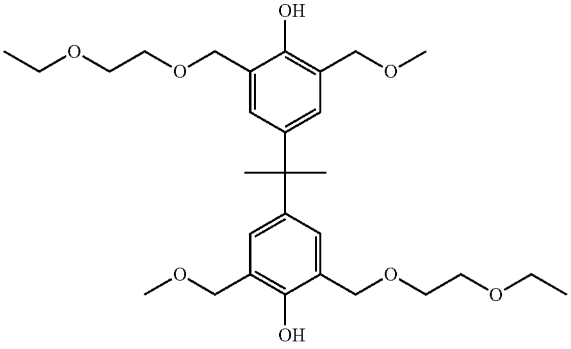
-continued
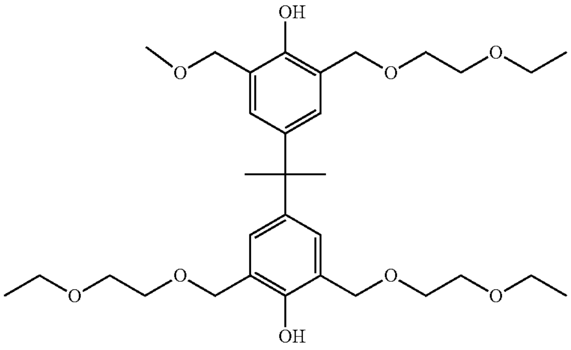
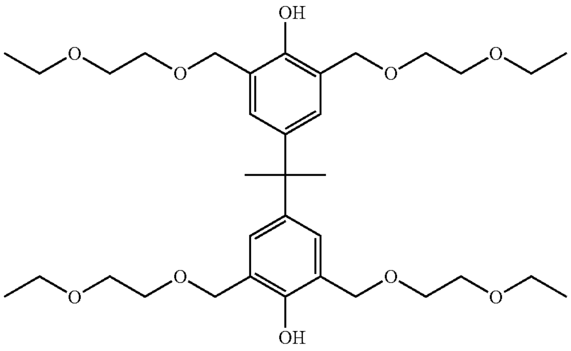
[Chemical formula 24]
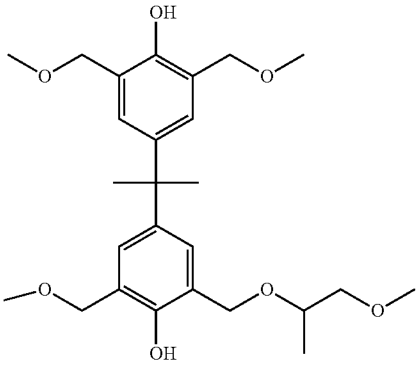
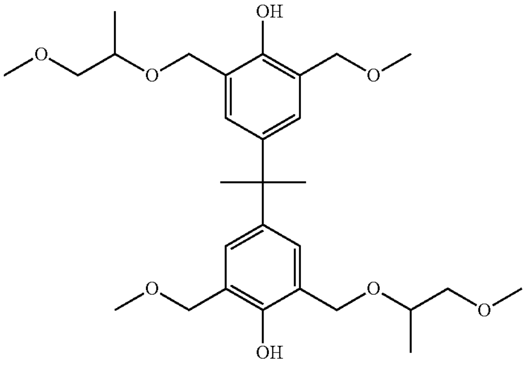

-continued
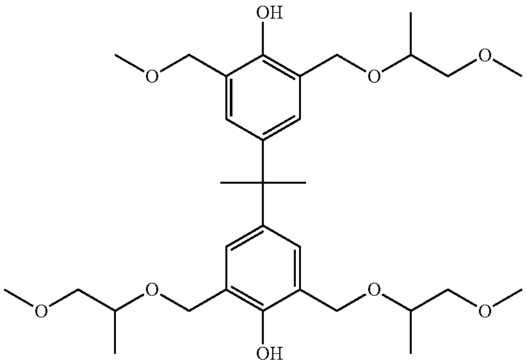
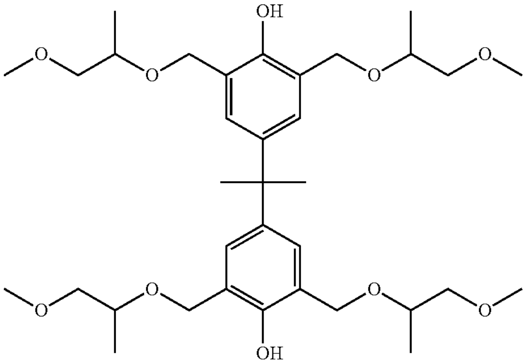
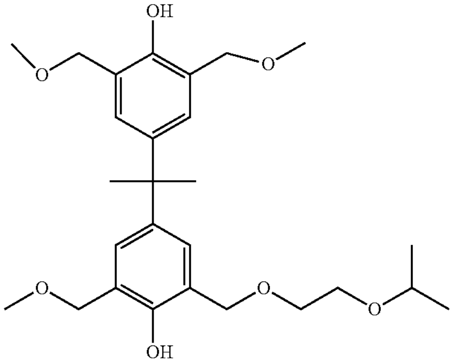
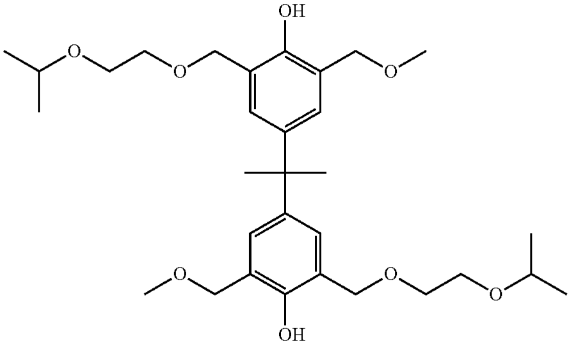
-continued
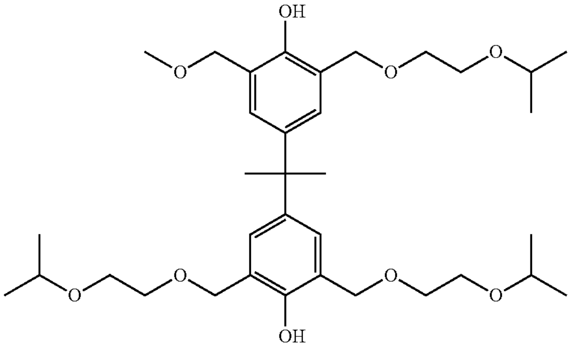
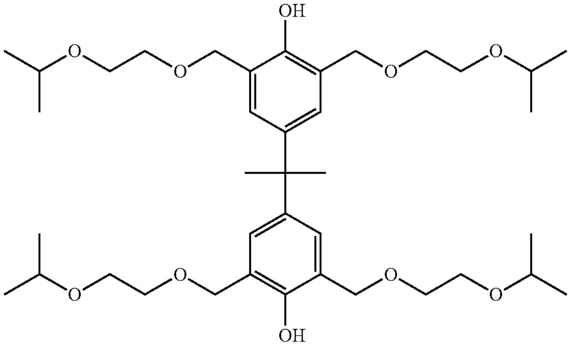
Examples of the compounds represented by formula (G-3) or (G-4) above include the followings.
[Chemical formula 25]
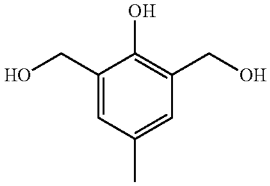
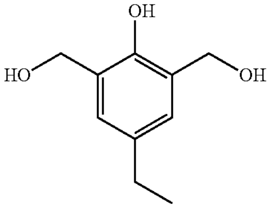
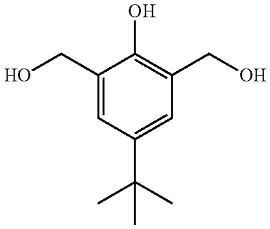
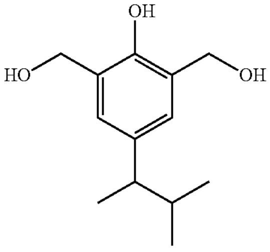
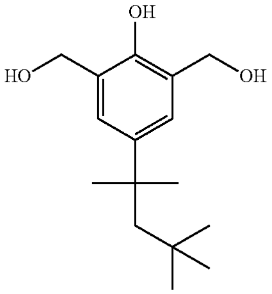
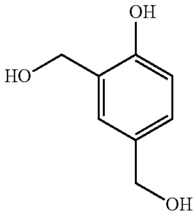

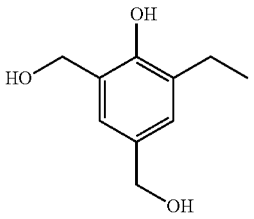
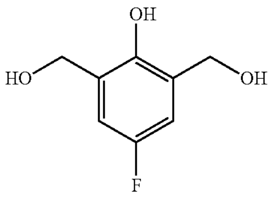
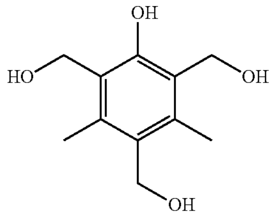
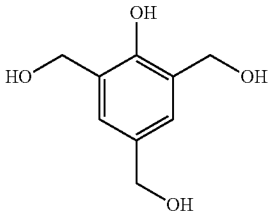
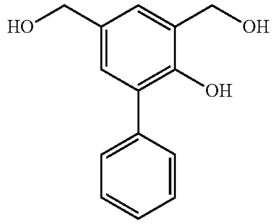
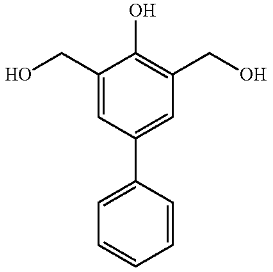
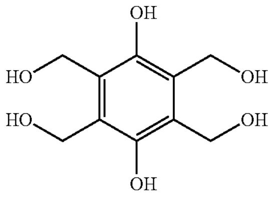
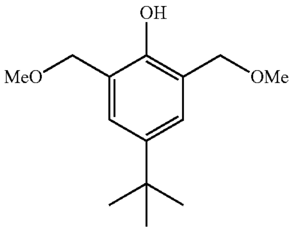
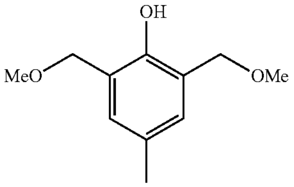
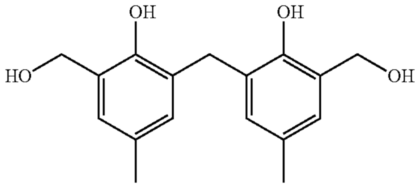
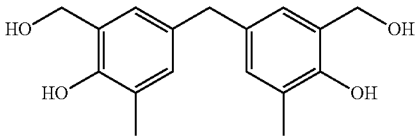
[Chemical formula 26]
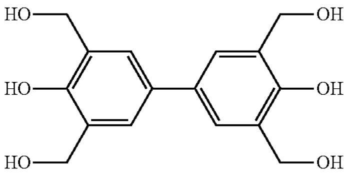
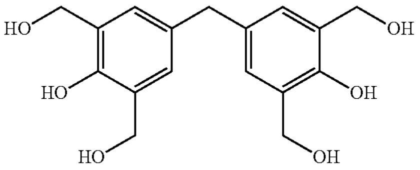
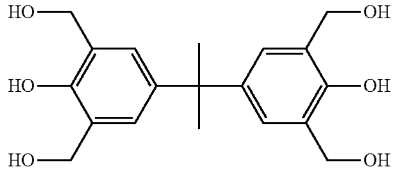
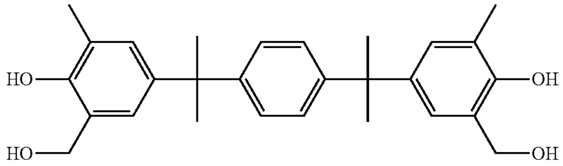
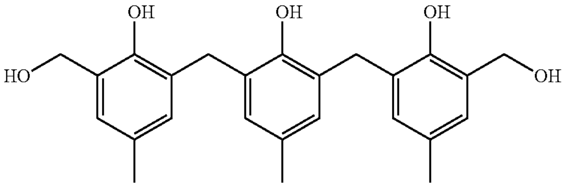
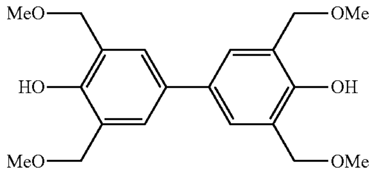
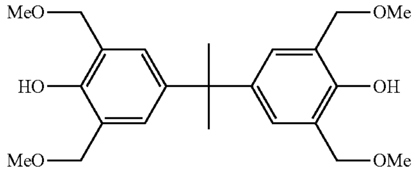
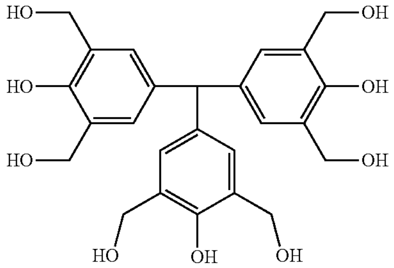
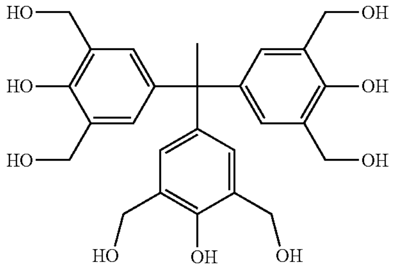

-continued

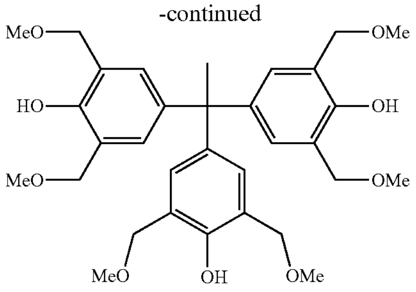

In the formulae, Me represents a methyl group.

The entire disclosure of WO 2014/208542 is incorporated herein by reference.

When the crosslinking agent is used, the amount of the crosslinking agent contained is, for example, within the range of 1 to 50% by mass, preferably 5 to 30% by mass, based on the mass of the reaction product.

<Other Components>

In the film-forming composition of the present invention, for further improving the application properties to prevent the occurrence of pinhole or striation and uneven surface, a surfactant may further be added to the composition. Examples of surfactant include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (trade name, manufactured by Tohchem Products Co., Ltd.), MEGAFACE F171, F173, R-30 (trade name, manufactured by DIC Corporation), Fluorad FC430, FC431 (trade name, manufactured by Sumitomo 3M), AsahiGuard AG710, Surflon S-382, SC101, SC102, SC103, SC104, SC105, SC106 (trade name, manufactured by AGC Inc.), and organosiloxane polymer KP341 (manufactured by Shin-Etsu Chemical Co., Ltd.). The amount of the surfactant incorporated is generally 2.0% by mass or less, preferably 1.0% by mass or less, based on the mass of the solids of the resist underlayer film-forming composition of the present invention. These surfactants may be used each alone or in combination of two or more thereof.

The film-forming composition of the present invention is preferably an electron beam resist underlayer film-forming composition or EUV resist underlayer film-forming composition, which is used in the electron beam (EB) lithography step or EUV exposure step, preferably an EUV resist underlayer film-forming composition.

<Resist Underlayer Film>

The resist underlayer film of the present invention may be produced by applying the above-described film-forming composition onto a semiconductor substrate and baking the applied composition.

The resist underlayer film of the present invention is preferably an electron beam resist underlayer film or EUV resist underlayer film.

Examples of semiconductor substrate to which the resist underlayer film-forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a BPSG (Boro-Phospho Silicate Glass) film, a titanium nitride film, a titanium nitride oxide film, a tungsten film, a gallium nitride film, and a gallium arsenide film.

The resist underlayer film-forming composition of the present invention is applied onto the above-mentioned semiconductor substrate by an appropriate application method, such as a spinner or a coater. Then, the applied composition is baked using a heating means, such as a hotplate, to form a resist underlayer film. The conditions for baking are appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes.

The thickness of the formed resist underlayer film is, for example, within the range of 0.001 μm (1 nm) to 10 μm, 0.002 μm (2 nm) to 1 μm, 0.005 μm (5 nm) to 0.5 μm (500 nm), 0.001 μm (1 nm) to 0.05 μm (50 nm), 0.002 μm (2 nm) to 0.05 μm (50 nm), 0.003 μm (1 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (20 nm), or 0.005 μm (5 nm) to 0.02 μm (20 nm). When the temperature for baking is lower than the above-mentioned range, crosslinking becomes unsatisfactory. On the other hand, when the temperature for baking is higher than the above-mentioned range, the resist underlayer film is likely to be decomposed due to heat.

<Method for Producing a Patterned Substrate and Method for Producing a Semiconductor Device>

The method for producing a patterned substrate comprises the steps described below. Generally, a patterned substrate is produced by forming a photoresist layer on a resist underlayer film. With respect to the photoresist formed on the resist underlayer film by applying and baking by a known method, there is no particular limitation as long as it is sensitive to a light used in the exposure. Any of a negative photoresist and a positive photoresist may be used. They include, for example, a positive photoresist comprising a novolak resin and 1,2-naphthoquinonediazidosulfonate, a chemical amplification photoresist comprising a binder having a group which is decomposed due to an acid to increase the alkali solubility and a photo-acid generator, a chemical amplification photoresist comprising a low-molecular weight compound which is decomposed due to an acid to increase the alkali solubility of the photoresist, an alkali-soluble binder, and a photo-acid generator, a chemical amplification photoresist comprising a binder having a group which is decomposed due to an acid to increase the alkali solubility, a low-molecular weight compound which is decomposed due to an acid to increase the alkali solubility of the photoresist, and a photo-acid generator, and a resist containing a metal element. For example, they include trade name: V146G, manufactured by JSR Corporation, trade name: APEX-E, manufactured by Shipley Company, Inc., trade name: PAR710, manufactured by Sumitomo Chemical Co., Ltd., and trade name: AR2772, SEPR430, manufactured by Shin-Etsu Chemical Co., Ltd. Further, they include fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000). Further, they include the so-called metal-containing resist containing a metal (metal resist). As specific examples, there may be used the resist composition, radiation-sensitive resin composition, the so-called resist composition, e.g., a high resolution patterning composition based on an organometal solution, and metal-containing resist composition, which are described in, for example, WO 2019/188595, WO 2019/187881, WO 2019/187803, WO 2019/167737, WO 2019/167725, WO 2019/187445, WO 2019/167419, WO 2019/123842, WO 2019/054282, WO 2019/058945, WO 2019/058890, WO 2019/039290, WO 2019/044259, WO 2019/044231, WO 2019/026549, WO 2018/193954, WO 2019/172054, WO 2019/021975, WO 2018/230334, WO 2018/194123, JP 2018-180525, WO 2018/190088, JP 2018-070596, JP 2018-028090, JP 2016-153409, JP 2016-130240, JP 2016-108325, JP 2016-047920, JP 2016-035570, JP 2016-035567, JP 2016-035565, JP 2019-101417, JP 2019-117373, JP 2019-052294, JP 2019-008280, JP 2019-008279, JP 2019-003176, JP 2019-003175, JP 2018-197853, JP 2019-191298, JP 2019-061217, JP 2018-045152, JP 2018-022039, JP 2016-090441, JP 2015-10878, JP 2012-168279, JP 2012-022261, JP 2012-022258, JP 2011-043749, JP 2010-181857, and JP 2010-128369, WO 2018/031896, JP 2019-113855, WO 2017/156388, WO 2017/066319, JP 2018-41099, WO 2016/065120, WO 2015/026482, and JP 2016-29498 and JP 2011-253185, but the resist is not limited to these compositions.

Examples of the resist composition include the followings.

An active light-sensitive or radiation-sensitive resin composition which comprises a resin A having repeating units having an acid decomposable group which has a polar group protected by a protecting group capable of being eliminated due to an effect of an acid, and a compound represented by the general formula (1).

[Chemical formula 27]

(1)

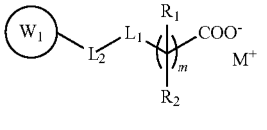

In the general formula (1), m represents an integer of 1 to 6.

Each of $R_1$ and $R_2$ independently represents a fluorine atom or a perfluoroalkyl group.

$L_1$ represents —O—, —S—, —COO—, —$SO_2$—, or —$SO_3$—.

$L_2$ represents an optionally substituted alkylene group or a single bond.

$W_1$ represents an optionally substituted cyclic organic group.

$M^+$ represents a cation.

A metal-containing film-forming composition for extreme ultraviolet light or electron beam lithography, which comprises a solvent and a compound having a metal-oxygen covalent bond, wherein the metal element constituting the compound belongs to Periods 3 to 7 of Groups 3 to 15 of the periodic table.

A radiation-sensitive resin composition which comprises an acid generator and a polymer having a first structural unit represented by the following formula (1) and a second structural unit being represented by the following formula (2) and containing an acid dissociating group:

[Chemical formula 28]

(1)

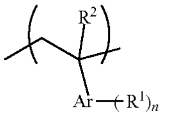

(2)

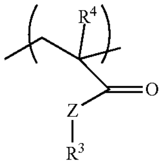

wherein, in formula (1), Ar is a group obtained by removing (n+1) hydrogen atoms from an arene having 6 to 20 carbon atoms, $R^1$ is a hydroxy group, a sulfanyl group, or a monovalent organic group having 1 to 20 carbon atoms, n is an integer of 0 to 11, wherein when n is 2 or more, two or more $R^1$ are the same or different, and $R^2$ is a hydrogen atom, a fluorine atom, a methyl group, or a trifluoromethyl group, and, in formula (2), $R^3$ is a monovalent group having 1 to 20 carbon atoms and containing the acid dissociating group, Z is a single bond, an oxygen atom, or a sulfur atom, and $R^4$ is a hydrogen atom, a fluorine atom, a methyl group, or a trifluoromethyl group.

A resist composition which comprises an acid generator and a resin (A1) containing a structural unit having a cyclic carbonate structure, a structural unit represented by formula (II), and a structural unit having an acid destabilizing group:

[Chemical formula 29]

(II)

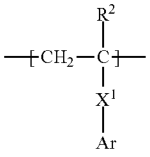

wherein $R^2$ represents a halogen atom, a hydrogen atom, or an alkyl group having 1 to 6 carbon atoms and optionally having a halogen atom, $X^1$ represents a single bond, —CO—O—*, or —CO—$NR^4$—* wherein * represents a bonding site with —Ar, and $R^4$ represents a hydrogen atom or an alkyl group having 1 to 4 carbon atoms, and Ar represents an aromatic hydrocarbon group having 6 to 20 carbon atoms and optionally having at least one group selected from the group consisting of a hydroxy group and a carboxyl group.

A resist composition which generates an acid by exposure and changes in the solubility in a developer due to an effect of the acid, wherein the resist composition comprises a base component (A) which changes in the solubility in a developer due to an effect of an acid, and a fluorine additive component (F) which has decomposition properties with respect to an alkaline developer, wherein the fluorine additive component (F) comprises a fluorine resin component (F1) having a constitutional unit (f1) containing a base dissociating group and a constitutional unit (f2) containing a group represented by the following general formula (f2-r-1):

[Chemical formula 30]

(f2-r-1)

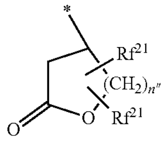

wherein each $Rf^{21}$ is independently a hydrogen atom, an alkyl group, an alkoxy group, a hydroxy group, a hydroxyalkyl group, or a cyano group, n" is an integer of 0 to 2, and * is a bonding site.

The resist composition wherein constitutional units (f1) contain a constitutional unit represented by the following general formula (f1-1) or a constitutional unit represented by the following general formula (f1-2):

[Chemical formula 31]

(f1-1)

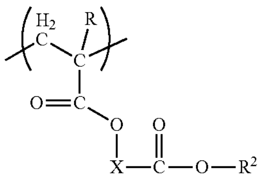

(f1-2)

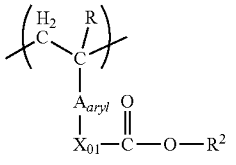

wherein each R is independently a hydrogen atom, an alkyl group having 1 to 5 carbon atoms, or a halogenated alkyl group having 1 to 5 carbon atoms, X is a divalent linking group having no acid dissociating site, $A_{aryl}$ is a divalent aromatic cyclic group optionally having a substituent, $X_{01}$ is a single bond or a divalent linking group, and each $R^2$ is independently an organic group having a fluorine atom.

Examples of the resist materials include the followings.

A resist material which comprises a polymer having a repeating unit represented by the following formula (a1) or (a2):

[Chemical formula 32]

(a1)

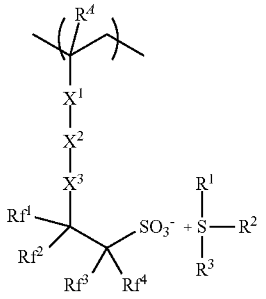

(a2)

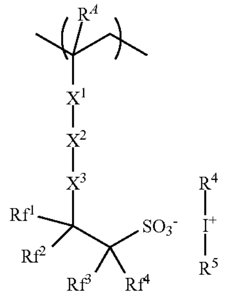

wherein $R^A$ is a hydrogen atom or a methyl group, $X^1$ is a single bond or an ester group, $X^2$ is a linear, branched, or cyclic alkylene group having 1 to 12 carbon atoms or an arylene group having 6 to 10 carbon atoms, wherein part of the methylene group constituting the alkylene group is optionally substituted with an ether group, an ester group, or a lactone ring-containing group, and wherein at least one hydrogen atom contained in $X^2$ is replaced by a bromine atom, $X^3$ is a single bond, an ether group, an ester group, or a linear, branched, or cyclic alkylene group having 1 to 12 carbon atoms, wherein part of the methylene group constituting the alkylene group is optionally substituted with an ether group or an ester group, each of $Rf^1$ to $Rf^4$ is independently a hydrogen atom, a fluorine atom, or a trifluoromethyl group, wherein at least one of $Rf^1$ to $Rf^4$ is a fluorine atom or a trifluoromethyl group, and wherein $Rf^1$ and $Rf^2$ are optionally bonded together to form a carbonyl group, and each of $Rf^1$ to $R^5$ is independently a linear, branched, or cyclic alkyl group having 1 to 12 carbon atoms, a linear, branched, or cyclic alkenyl group having 2 to 12 carbon atoms, an alkynyl group having 2 to 12 carbon atoms, an aryl group having 6 to 20 carbon atoms, an aralkyl group having 7 to 12 carbon atoms, or an aryloxyalkyl group having 7 to 12 carbon atoms, wherein part of or all of hydrogen atoms of the above group are optionally replaced by a hydroxy group, a carboxyl group, a halogen atom, an oxo group, a cyano group, an amido group, a nitro group, a sultone group, a sulfone group, or a sulfonium salt-containing group, wherein part of the methylene group constituting the above group is optionally substituted with an ether group, an ester group, a carbonyl group, a carbonate group, or a sulfonate group, and wherein $R^1$ and $R^2$ are optionally bonded to form a ring, together with the sulfur atom to which $R^1$ and $R^2$ are bonded.

A resist material which comprises a base resin containing a polymer having a repeating unit represented by the following formula (a):

[Chemical formula 33]

(a)

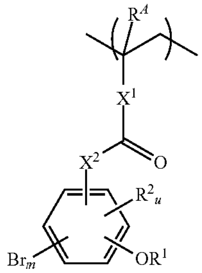

wherein $R^A$ is a hydrogen atom or a methyl group, $R^1$ is a hydrogen atom or an acid destabilizing group, $R^2$ is a linear, branched, or cyclic alkyl group having 1 to 6 carbon atoms, or a halogen atom other than bromine, $X^1$ is a single bond, a phenylene group, or a linear, branched, or cyclic alkylene group having 1 to 12 carbon atoms and optionally having an ester group or a lactone ring, $X^2$ is —O—, —O—$CH_2$—, or —NH—, m is an integer of 1 to 4, and n is an integer of 0 to 3.

Examples of the resist films include the followings.

(i) A resist film which comprises a base resin having a repeating unit represented by the following formula (a1) and/or a repeating unit represented by the following formula (a2), and a repeating unit which generates an acid bonded to a polymer principal chain by exposure:

[Chemical formula 34]

(a1)

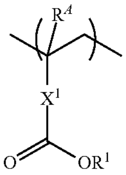

(a2)

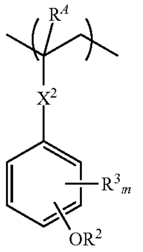

wherein each $R^A$ is independently a hydrogen atom or a methyl group, each of $R^1$ and $R^2$ is independently a tertiary alkyl group having 4 to 6 carbon atoms, each $R^3$ is independently a fluorine atom or a methyl group, m is an integer of 0 to 4, $X^1$ is a single bond, a phenylene group, a naphthylene group, or a linking group having 1 to 12 carbon atoms and containing at least one member selected from an ester linkage, a lactone ring, a phenylene group, and a naphthylene group, and $X^2$ is a single bond, an ester linkage, or an amide linkage.

Examples of coating solutions include the followings.

Examples of the metal-containing resist composition include a coating containing a metal oxo-hydroxo network having an organic ligand through a metal carbon bond and/or a metal carboxylate bond.

An inorganic oxo/hydroxo base composition.

A coating solution which comprises an organic solvent; a first organometallic composition, which is represented by the formula: $R_zSnO_{(2-(z/2)-(x/2))}(OH)_x$ (wherein $0<z\leq 2$ and $0<(z+x)\leq 4$), the formula: $R'_nSnX_{4-n}$ (wherein n=1 or 2), or a mixture thereof, wherein each of R and R′ is independently a hydrocarbyl group having 1 to 31 carbon atoms, and X is a ligand having a hydrolyzable bond for Sn or a combination thereof; and a hydrolyzable metal compound represented by the formula: $MX'_v$ (wherein M is a metal selected from Groups 2 to 16 of the periodic table of elements, v is a number of 2 to 6, and X′ is a ligand having a hydrolyzable M-X bond or a combination thereof).

A coating solution which comprises an organic solvent and a first organometallic compound represented by the formula: $RSNO_{(3/2-x/2)}(OH)_x$ (wherein $0<x<3$), wherein the solution contains tin in an amount of about 0.0025 to about 1.5 M, and R is an alkyl group or cycloalkyl group having 3 to 31 carbon atoms, wherein the alkyl group or cycloalkyl group is bonded to tin at a secondary or tertiary carbon atom.

An aqueous solution of an inorganic pattern-forming precursor which comprises a mixture of water, metal suboxide cations, polyatomic inorganic anions, and a radiation-sensitive ligand containing a peroxide group.

Exposure through a mask (reticle) for forming a predetermined pattern is conducted, and, for example, an i-line, a KrF excimer laser, an ArF excimer laser, an EUV (extreme ultraviolet light), or an EB (electron beam) is used, and the resist underlayer film-forming composition of the present invention is preferably used in the EUV (extreme ultraviolet light) exposure. In development, an alkaline developer is used, and the conditions are appropriately selected from those at a development temperature of 5 to 50° C. for a development time of 10 to 300 seconds. As an alkaline developer, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine may be used. Further, the above-mentioned aqueous alkali solution which has added thereto an alcohol, such as isopropyl alcohol, or a surfactant, such as a nonionic surfactant, in an appropriate amount, may be used. Of these, a preferred developer is a quaternary ammonium salt, and further preferred are tetramethylammonium hydroxide and choline. Further, for example, a surfactant may be added to the above developer. Instead of the method using an alkaline developer, a method may be used in which development is conducted using an organic solvent, such as butyl acetate, to develop a portion of the photoresist in which the alkali dissolution rate is not improved. The substrate having the resist patterned can be produced through the above-described steps.

Then, using the formed resist pattern as a mask, the resist underlayer film is subjected to dry etching. In this instance, when the above-mentioned inorganic film is formed on the surface of the semiconductor substrate used, the surface of the inorganic film is exposed, and, when the inorganic film is not formed on the surface of the semiconductor substrate used, the surface of the semiconductor substrate is exposed. Then, the substrate is subjected to the step of processing a substrate by a known method (such as a dry etching method), producing a semiconductor device.

EXAMPLES

Hereinbelow, the contents of the present invention will be described in more detail with reference to the following Examples, which should not be construed as limiting the scope of the present invention.

The weight average molecular weight of the polymer shown in the following Synthesis Example 1 and Comparative Synthesis Example 1 in the present description is the result of the measurement by gel permeation chromatography (hereinafter, referred to simply as "GPC"). In the measurement, a GPC apparatus, manufactured by Tosoh Corp., was used, and the conditions for the measurement and others are as follows. GPC Column: Shodex KF803L, Shodex KF802, Shodex KF801 [registered trademark] (Showa Denko K.K.)

Column temperature: 40° C.

Solvent: Tetrahydrofuran (THF)

Flow rate: 1.0 ml/minute

Standard sample: Polystyrene (manufactured by Tosoh Corp.)

Synthesis Example 1

In a reaction vessel were placed 6.72 g of 4,4⌷ diphenyl sulfone tetracarboxylic dianhydride (manufactured by New Japan Chemical Co., Ltd.), 15.01 g of 3-butyn-1-ol (manufactured by Tokyo Chemical Industry Co., Ltd.), and 0.08 g of 2,6-di-tert-butyl-p-cresol (manufactured by Tokyo Chemical Industry Co., Ltd.), the reaction vessel was purged with nitrogen gas, and then the resultant mixture was heated at 80° C. for 18 hours while stirring. After cooling to room temperature, 5.00 g of monoallyldiglycidylisocyanuric acid (manufactured by Shikoku Chemicals Corporation), 0.30 g of tetrabutylphosphonium bromide (manufactured by Hokko Chemical Industry Co., Ltd.), and 36.50 g of propylene glycol monomethyl ether were added to the mixture, the reaction vessel was purged with nitrogen gas, and then the resultant mixture was subjected to reaction at 105° C. for 24 hours to obtain a solution containing a polymer. After cooling to room temperature, the obtained solution was subjected to reprecipitation by dropwise adding the solution to 2-propanol. Then, the precipitate was subjected to filtration by means of suction using a Buchner funnel, washed with 2-propanol twice, and the resultant solid was dried by means of a vacuum dryer for 12 hours, obtaining polymer 1. A GPC analysis made with respect to the obtained polymer 1 showed that polymer 1 had a weight average molecular weight of 3,400, as determined using a conversion calibration curve obtained from the standard polystyrene, and a polydispersity of 2.8. The structure present in polymer 1 is represented by the following formula.

[Chemical formula 35]

1

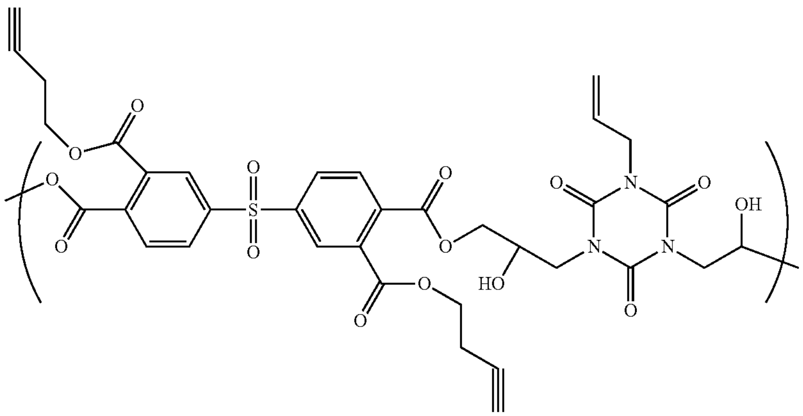

Synthesis Example 2

In a reaction vessel were placed 5.44 g of 4,4⌷ diphenyl sulfone tetracarboxylic dianhydride (manufactured by New Japan Chemical Co., Ltd.), 0.88 g of 5-norbornene-2,3-dicarboxylic anhydride (manufactured by Tokyo Chemical Industry Co., Ltd.), 15.00 g of 3-butyn-1-ol (manufactured by Tokyo Chemical Industry Co., Ltd.), and 0.08 g of 2,6-di-tert-butyl-p-cresol (manufactured by Tokyo Chemical Industry Co., Ltd.), the reaction vessel was purged with nitrogen gas, and then the resultant mixture was heated at 80° C. for 18 hours while stirring. After cooling to room temperature, 5.00 g of monoallyldiglycidylisocyanuric acid (manufactured by Shikoku Chemicals Corporation), 0.30 g of tetrabutylphosphonium bromide (manufactured by Hokko Chemical Industry Co., Ltd.), and 35.12 g of propylene glycol monomethyl ether were added to the mixture, the reaction vessel was purged with nitrogen gas, and then the resultant mixture was subjected to reaction at 105° C. for 24 hours to obtain a solution containing a polymer. After cooling to room temperature, the obtained solution was subjected to reprecipitation by dropwise adding the solution to 2-propanol. Then, the precipitate was subjected to filtration by means of suction using a Buchner funnel, washed with 2-propanol twice, and the resultant solid was dried by means of a vacuum dryer for 12 hours, obtaining polymer 2. A GPC analysis made with respect to the obtained polymer 2 showed that polymer 2 had a weight average molecular weight of 5,000, as determined using a conversion calibration curve obtained from the standard polystyrene, and a polydispersity of 2.6. The structure present in polymer 2 is represented by the following formula.

[Chemical formula 36]

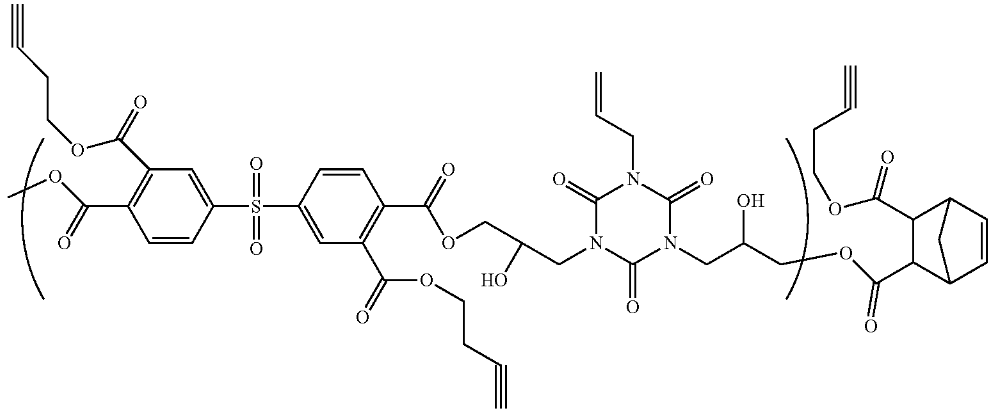

2

Synthesis Example 3

In a reaction vessel were placed 5.44 g of 4,4□ diphenyl sulfone tetracarboxylic dianhydride (manufactured by New Japan Chemical Co., Ltd.), 0.88 g of 5-norbornene-2,3-dicarboxylic anhydride (manufactured by Tokyo Chemical Industry Co., Ltd.), 15.00 g of 2-propyn-1-ol (manufactured by Tokyo Chemical Industry Co., Ltd.), 15.00 g of N-methyl-2-pyrrolidinone, and 0.08 g of 2,6-di-tert-butyl-p-cresol (manufactured by Tokyo Chemical Industry Co., Ltd.), the reaction vessel was purged with nitrogen gas, and then the resultant mixture was heated at 80° C. for 18 hours while stirring. After cooling to room temperature, 5.00 g of monoallyldiglycidylisocyanuric acid (manufactured by Shikoku Chemicals Corporation), 0.30 g of tetrabutylphosphonium bromide (manufactured by Hokko Chemical Industry Co., Ltd.), and 20.12 g of propylene glycol monomethyl ether were added to the mixture, the reaction vessel was purged with nitrogen gas, and then the resultant mixture was subjected to reaction at 105° C. for 24 hours to obtain a solution containing a polymer. After cooling to room temperature, the obtained solution was subjected to reprecipitation by dropwise adding the solution to 2-propanol. Then, the precipitate was subjected to filtration by means of suction using a Buchner funnel, washed with 2-propanol twice, and the resultant solid was dried by means of a vacuum dryer for 12 hours, obtaining polymer 3. A GPC analysis made with respect to the obtained polymer 3 showed that polymer 3 had a weight average molecular weight of 4,800, as determined using a conversion calibration curve obtained from the standard polystyrene, and a polydispersity of 2.0. The structure present in polymer 3 is represented by the following formula.

[Chemical formula 37]

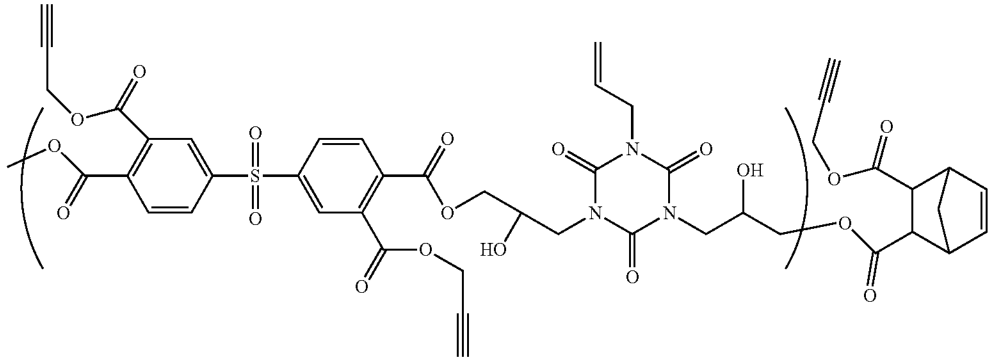

3

Synthesis Example 4

In a reaction vessel were placed 5.44 g of 4,4□ diphenyl sulfone tetracarboxylic dianhydride (manufactured by New Japan Chemical Co., Ltd.), 0.88 g of 5-norbornene-2,3-dicarboxylic anhydride (manufactured by Tokyo Chemical Industry Co., Ltd.), 15.00 g of 2-hydroxyethyl methacrylate (manufactured by Tokyo Chemical Industry Co., Ltd.), 15.00 g of N-methyl-2-pyrrolidinone, and 0.08 g of 2,6-di-tert-butyl-p-cresol (manufactured by Tokyo Chemical Industry Co., Ltd.), the reaction vessel was purged with nitrogen gas, and then the resultant mixture was heated at 80° C. for 18 hours while stirring. After cooling to room temperature, 5.00 g of monoallyldiglycidylisocyanuric acid (manufactured by Shikoku Chemicals Corporation), 0.30 g of tetrabutylphosphonium bromide (manufactured by Hokko Chemical Industry Co., Ltd.), and 20.12 g of propylene glycol monomethyl ether were added to the mixture, the reaction vessel was purged with nitrogen gas, and then the resultant mixture was subjected to reaction at 105° C. for 24 hours to obtain a solution containing a polymer. After cooling to room temperature, the obtained solution was subjected to reprecipitation by dropwise adding the solution to 2-propanol. Then, the precipitate was subjected to filtration by means of suction using a Buchner funnel, washed with 2-propanol twice, and the resultant solid was dried by means of a vacuum dryer for 12 hours, obtaining polymer 4. A GPC analysis made with respect to the obtained polymer 4 showed that polymer 4 had a weight average molecular weight of 5,500, as determined using a conversion calibration curve obtained from the standard polystyrene, and a polydispersity of 2.1. The structure present in polymer 4 is represented by the following formula.

[Chemical formula 38]

4

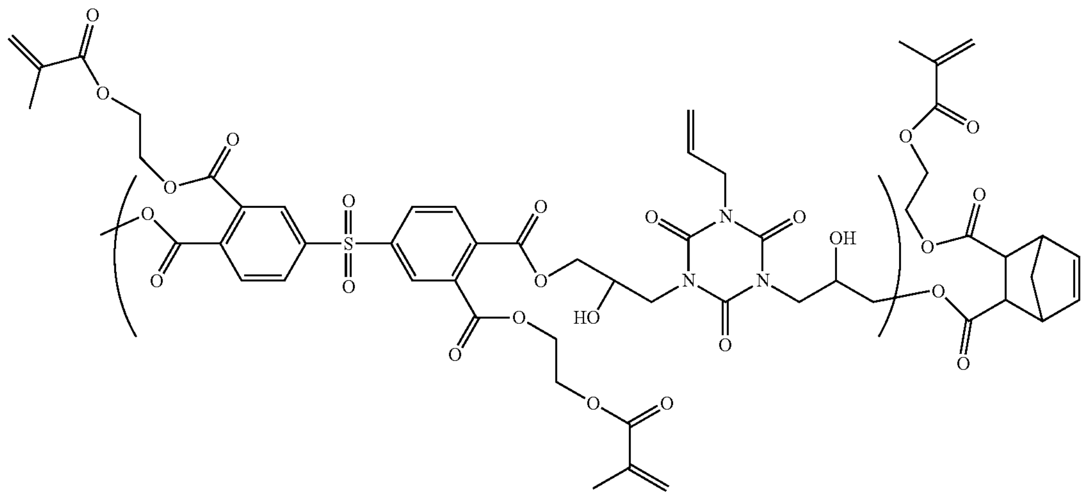

Comparative Synthesis Example 1

As raw materials for comparative polymer 1, 3.00 g of monoallyldiglycidylisocyanuric acid (manufactured by Shikoku Chemicals Corporation), 3.27 g of 3,3,□4 ,4 □ diphenyl sulfone tetracarboxylic dianhydride (manufactured by New Japan Chemical Co., Ltd.), 0.53 g of 5-norbornene-2,3-dicarboxylic anhydride (manufactured by Tokyo Chemical Industry Co., Ltd.), 0.10 g of 2,6-di-tert-butyl-p-cresol (manufactured by Tokyo Chemical Industry Co., Ltd.), and 0.27 g of tetrabutylphosphonium bromide (manufactured by Hokko Chemical Industry Co., Ltd.) were added to 21.49 g of propylene glycol monomethyl ether to dissolve the solids. The reaction vessel was purged with nitrogen gas, and then the resultant solution was subjected to reaction at 105° C. for 24 hours to obtain a solution containing comparative polymer 1. A GPC analysis made with respect to the obtained solution showed that the obtained comparative polymer 1 had a weight average molecular weight of 12,600, as determined using a conversion calibration curve obtained from the standard polystyrene, and a polydispersity of 4.2. The structure present in comparative polymer 1 is represented by the following formula.

[Chemical formula 39]

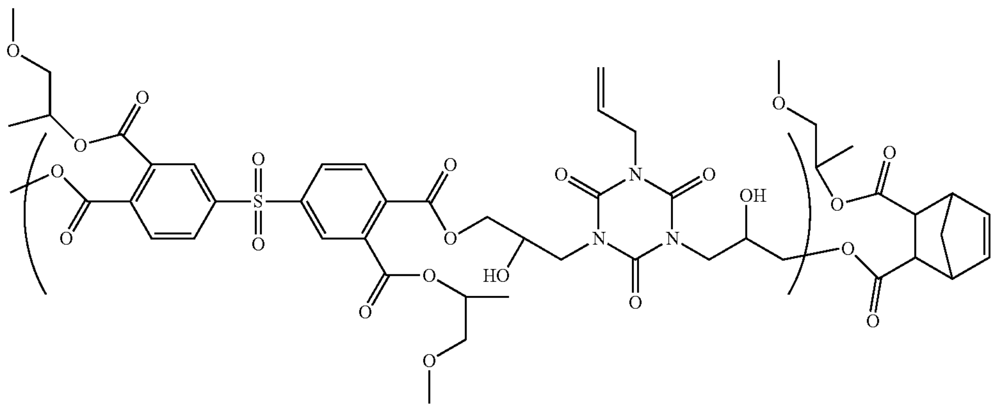

(Preparation of a Resist Underlayer Film)

EXAMPLES AND COMPARATIVE EXAMPLE

Each of the polymers obtained in Synthesis Examples 1 to 4 and Comparative Synthesis Example 1 above, a crosslinking agent, a curing catalyst, and a solvent were mixed in the proportions shown in Tables 1 and 2. The mixture was subjected to filtration using a 0.1 μm fluororesin filter, preparing a resist underlayer film-forming composition in the form of a solution.

In Tables 1 and 2, Imidazo[4,5-d]imidazole-2,5(1H,3H)-dione, tetrahydro-1,3,4,6-tetrakis[(2-methoxy-1-methylethoxy)methyl]- was abbreviated to PGME-PL, pyridinium p-hydroxybenzenesulfonate was abbreviated to PyPSA, propylene glycol monomethyl ether acetate was abbreviated to PGMEA, and propylene glycol monomethyl ether was abbreviated to PGME. The amount of each component was indicated by parts by mass.

TABLE 1

| | Polymer | Cross-linking agent | Curing catalyst | Solvent | |
|---|---|---|---|---|---|
| Example 1 (Parts by mass) | Synthesis Example 1 0.15 | PGME-PL 0.04 | PyPSA 0.01 | PGME 70 | PGMEA 30 |
| Example 2 (Parts by mass) | Synthesis Example 2 0.15 | PGME-PL 0.04 | PyPSA 0.01 | PGME 70 | PGMEA 30 |
| Example 3 (Parts by mass) | Synthesis Example 3 0.15 | PGME-PL 0.04 | PyPSA 0.01 | PGME 70 | PGMEA 30 |
| Example 4 (Parts by mass) | Synthesis Example 4 0.15 | PGME-PL 0.04 | PyPSA 0.01 | PGME 70 | PGMEA 30 |

TABLE 2

| | Polymer | Cross-linking agent | Curing catalyst | Solvent | |
|---|---|---|---|---|---|
| Comparative Example 1 (Parts by mass) | Comparative Synthesis Example 1 0.15 | PGME-PL 0.04 | PyPSA 0.01 | PGME 70 | PGMEA 30 |

(Test for Dissolution into a Photoresist Solvent)

Each of the resist underlayer film-forming compositions in Examples 1 to 4 and Comparative Example 1 was applied onto a silicon wafer using a spinner. The silicon wafer was baked on a hotplate at 205° C. for 60 seconds to obtain a film having a thickness of 5 nm. The formed resist underlayer film was immersed in a mixed solvent of propylene glycol monomethyl ether/propylene glycol monomethyl ether=70/30, which are the solvent used in the photoresist. Table 3 shows the results, while the rating "Excellent" indicates that the change of the thickness of the film is 1 Å or less, and the rating "Poor" indicates that the change of the thickness of the film is 1 Å or more.

(Hardness Test)

Each of the resist underlayer film-forming compositions in Examples 1 to 4 and Comparative Example 1 was applied onto a silicon wafer using a spinner. The silicon wafer was baked on a hotplate at 205° C. for 60 seconds to obtain a film having a thickness of 200 nm. The obtained resist underlayer film was subjected to measurement using a nanoindenter. Table 3 shows the results, while expressing the value of hardness by taking the hardness of the film in Comparative Example 1 as 1.

TABLE 3

| | Dissolution test | Hardness (Hardness in Comparative Example 1 = 1.0) |
|---|---|---|
| Example 1 | Excellent | 1.24 |
| Example 2 | Excellent | 1.18 |
| Example 3 | Excellent | 1.27 |
| Example 4 | Excellent | 1.15 |
| Comparative Example 1 | Excellent | 1.00 |

(Evaluation of Resist Patterning)

[Test for Formation of a Resist Pattern by Electron Beam Lithography System]

The resist underlayer film-forming composition was applied onto a silicon wafer using a spinner. The silicon wafer was baked on a hotplate at 205° C. for 60 seconds to obtain a resist underlayer film having a thickness of 5 nm. An EUV positive resist solution was applied by spin coating onto the obtained resist underlayer film, and heated at 130° C. for 60 seconds to form an EUV resist film. The formed resist film was subjected to exposure under the predetermined conditions using an electron beam lithography system (ELS-G130). After the exposure, the resist film was baked (PEB) at 90° C. for 60 seconds, cooled to room temperature on a cooling plate, and subjected to puddle development for 30 seconds using a 2.38% aqueous solution of tetramethylammonium hydroxide (trade name: NMD-3, manufactured by Tokyo Ohka Kogyo Co., Ltd.) as a developer for photoresist. A resist pattern having a line size of 16 to 28 nm was formed. In the measurement of the length of the resist pattern, a scanning electron microscope (CG4100, manufactured by Hitachi High-Technologies Corporation) was used.

The thus obtained photoresist pattern was checked as to whether 22 nm line and space (L/S) was formed. In all Examples 1 to 4, the formation of 22 nm L/S pattern was confirmed. Further, while taking the amount of charge with which a 22 nm line/44 nm pitch (line and space (L/S=1/1) was formed as an optimum irradiation energy, the irradiation energy ($\mu C/cm^2$) at that time, the minimum CD size with which no collapse was found in the shot of the resist pattern, and LWR are shown in Table 4.

TABLE 4

| | Irradiation energy ($\mu C/cm^2$) | Minimum CD size (nm) | LWR (nm) |
|---|---|---|---|
| Example 1 | 454 | 17.4 | 3.07 |
| Example 2 | 455 | 17.2 | 3.10 |
| Example 3 | 465 | 17.3 | 3.06 |
| Example 4 | 466 | 18.1 | 3.07 |
| Comparative Example 1 | 456 | 18.5 | 3.17 |

INDUSTRIAL APPLICABILITY

The resist underlayer film-forming composition of the present invention can provide a composition for forming a resist underlayer film that is capable of forming a desired resist pattern, a method for producing a substrate having a resist pattern using the resist underlayer film-forming composition, and a method for producing a semiconductor device.

The invention claimed is:

1. A film-forming composition comprising a solvent and a polymer having a unit structure represented by the following formula (1):

[Chemical formula 40]

(1)

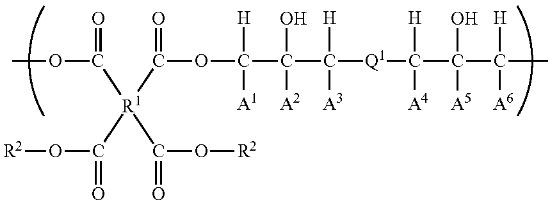

wherein each of $A^1$, $A^2$, $A^3$, $A^4$, $A^5$, and $A^6$ independently represents a hydrogen atom, a methyl group, or an ethyl group; $Q^1$ represents a divalent organic group; $R^1$ represents a tetravalent organic group; and $R^2$ represents an alkenyl group or alkynyl group having 2 to 10 carbon atoms.

2. The film-forming composition according to claim 1, wherein $R^1$ has an aromatic ring structure having 6 to 40 carbon atoms or an alicyclic structure having 4 to 20 carbon atoms.

3. The film-forming composition according to claim 1, wherein $R^1$ is represented by the following formula (2):

[Chemical formula 41]

(2)

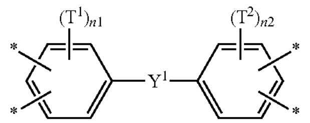

wherein $Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group; each of $T^1$ and $T^2$ independently represents a hydrogen atom or an alkyl group having 1 to 10 carbon atoms; each of n1 and n2 independently represents an integer of 0 to 4; and * is a bonding site to the carbon atom of carbonyl group to which $R^1$ is bonded.

4. The film-forming composition according to claim 1, wherein $Q^1$ has an alkenyl group or alkynyl group having 2 to 10 carbon atoms.

5. The film-forming composition according to claim 1, wherein $Q^1$ has a heterocycle.

6. The film-forming composition according to claim 1, wherein the polymer has at an end thereof an alkenyl group or alkynyl group having 2 to 10 carbon atoms.

7. The film-forming composition according to claim 1, wherein the polymer has at an end thereof an optionally substituted aliphatic ring.

8. The film-forming composition according to claim 1, further comprising an acid generator.

9. The film-forming composition according to claim 1, further comprising a crosslinking agent.

10. A resist underlayer film formed from the film-forming composition according to claim 1.

11. A resist underlayer film which is a baked product of an applied film of the film-forming composition according to claim 1.

12. A method for producing a patterned substrate, comprising the steps of:
- applying the film-forming composition according to claim 1 onto a semiconductor substrate and baking the applied composition to form a resist underlayer film;
- applying a resist onto the resist underlayer film and baking the applied resist to form a resist film;
- exposing the semiconductor substrate covered with the resist underlayer film and the resist; and
- developing the exposed film and performing patterning.

13. A method for producing a semiconductor device, comprising the steps of:
- forming a resist underlayer film comprising the film-forming composition according to claim 1 on a semiconductor substrate;
- forming a resist film on the resist underlayer film;
- irradiating the resist film with a light or an electron beam and then developing the resultant resist film to form a resist pattern;
- etching the resist underlayer film through the formed resist pattern to form a patterned resist underlayer film; and
- processing the semiconductor substrate using the patterned resist underlayer film.

* * * * *